(12) United States Patent
Eum et al.

(10) Patent No.: US 12,125,717 B2
(45) Date of Patent: Oct. 22, 2024

(54) APPARATUS FOR TREATING SUBSTRATE

(71) Applicant: SEMES CO., LTD., Chungcheongnam-do (KR)

(72) Inventors: Ki Sang Eum, Chungcheongnam-do (KR); Jin Ho Choi, Incheon (KR); Byoung Doo Choi, Chungcheongnam-do (KR); Seung Han Lee, Chungcheongnam-do (KR); Sun Wook Jung, Gyeonggi-do (KR); Si Eun Kim, Chungcheongbuk-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 500 days.

(21) Appl. No.: 17/533,348

(22) Filed: Nov. 23, 2021

(65) Prior Publication Data
US 2022/0165589 A1 May 26, 2022

(30) Foreign Application Priority Data

Nov. 23, 2020 (KR) .................. 10-2020-0157844

(51) Int. Cl.
*H01L 21/67* (2006.01)
*C23C 16/44* (2006.01)
(Continued)

(52) U.S. Cl.
CPC .... *H01L 21/67051* (2013.01); *C23C 16/4412* (2013.01); *C23C 16/45502* (2013.01); *H01L 21/68764* (2013.01); *H01L 21/02337* (2013.01)

(58) Field of Classification Search
CPC ................................ H01L 21/67051
See application file for complete search history.

(56) References Cited

U.S. PATENT DOCUMENTS 11,774,854 B2 * 10/2023 Hashimoto ........... G03F 7/3021
355/27
2003/0049384 A1 * 3/2003 Liu ......................... C23C 4/12
427/427
(Continued)

FOREIGN PATENT DOCUMENTS

JP   2000-237669 A   9/2000
JP   2011-249848 A   12/2011
(Continued)

OTHER PUBLICATIONS

Office Action dated Oct. 28, 2022 issued by the Korean Patent Office in corresponding Korean Patent Application No. 10-2020-0157844, with English translation.

*Primary Examiner* — William A Harriston
(74) *Attorney, Agent, or Firm* — Carter, DeLuca & Farrell LLP

(57) ABSTRACT

An apparatus for treating a substrate, the apparatus comprising: a processing container having an inner space; a support unit having a support plate configured to support and rotate the substrate in the inner space; a liquid supply unit supplying treating liquid to the substrate supported by the support unit; and an exhaust unit exhausting an air flow in the inner space, wherein the processing container includes a bottom wall and a side wall extending from the outside end of the bottom wall, the processing container including a first gas-liquid separator provided at the side wall.

19 Claims, 16 Drawing Sheets

(51) Int. Cl.
  *C23C 16/455*  (2006.01)
  *H01L 21/02*  (2006.01)
  *H01L 21/687*  (2006.01)

(56) References Cited

U.S. PATENT DOCUMENTS

| | | | |
|---|---|---|---|
| 2007/0119371 A1* | 5/2007 | Ma | H01J 37/32082 |
| | | | 118/715 |
| 2007/0238028 A1* | 10/2007 | Inatomi | H01L 21/6715 |
| | | | 430/5 |
| 2008/0280054 A1* | 11/2008 | Ogata | H01L 21/67051 |
| | | | 134/33 |
| 2009/0152238 A1* | 6/2009 | Inatomi | H01L 21/0273 |
| | | | 216/41 |
| 2015/0072536 A1* | 3/2015 | Muramatsu | H01L 21/0271 |
| | | | 355/27 |
| 2016/0064242 A1* | 3/2016 | Obweger | H01L 21/6708 |
| | | | 134/1 |
| 2016/0172257 A1* | 6/2016 | Kondo | H01L 22/26 |
| | | | 425/135 |
| 2018/0033605 A1* | 2/2018 | Ota | H01L 21/02321 |
| 2018/0047592 A1* | 2/2018 | Fukuda | G03F 7/3021 |
| 2018/0090342 A1* | 3/2018 | Hinode | H01L 21/31111 |
| 2019/0333755 A1* | 10/2019 | Hanawa | H01L 21/67103 |
| 2020/0384510 A1* | 12/2020 | Yoshida | C11D 3/3703 |

FOREIGN PATENT DOCUMENTS

| | | |
|---|---|---|
| KR | 1999-0077743 A | 10/1999 |
| KR | 10-0574303 A | 4/2006 |
| KR | 10-2009-0023278 A | 3/2009 |
| KR | 10-2020-0027161 A | 3/2020 |
| KR | 10-2238585 A | 4/2021 |

* cited by examiner

--PRIOR ART--

--PRIOR ART--

--PRIOR ART--

APPARATUS FOR TREATING SUBSTRATE

CROSS-REFERENCE TO RELATED APPLICATIONS

A claim for priority under 35 U.S.C. § 119 is made to Korean Patent Application No. 10-2020-0157844 filed on Nov. 23, 2020, in the Korean Intellectual Property Office, the entire contents of which are hereby incorporated by reference.

BACKGROUND

Embodiments of the inventive concept described herein relate to an apparatus for treating a substrate, and more particularly, relate to an apparatus for treating a substrate by supplying a liquid onto the rotating substrate.

Various processes such as a photolithography process, an etching process, an ashing process, a thin film deposition process, and a cleaning process are carried out to manufacture a semiconductor device or a flat plate display panel. Among these processes, the photolithography process includes supplying a photoresist to a semiconductor substrate to form a photoresist film on a surface of the substrate, exposing the photoresist film using a photomask, and then supplying a developing liquid to selectively remove portions of the photoresist film. These processes are performed in process chambers.

FIG. 1 is a schematic view illustrating a substrate treating apparatus 1 for applying photoresist to a substrate. Referring to FIG. 1, the substrate treating apparatus 1 includes a processing container 10 having an inner space, a support unit 20 for supporting the substrate W in the inner space, and a nozzle 30 for supplying a treating liquid 82 onto the substrate W placed on the support unit 20. The processing container 10 has an outer cup 12 and an inner cup 14. Furthermore, a fan filter unit (not shown) for supplying a downward air flow into the inner space is disposed over the processing container 10, and a drain tube 60 for draining the treating liquid and an exhaust tube 70 for exhausting an atmosphere in a processing space are connected to a bottom region of the inner space.

When the substrate treating apparatus 1 having the structure illustrated in FIG. 1 treats the substrate W while supplying the treating liquid 82 on the rotating substrate W, an air flow 84 on the surface of the substrate W flows from the center of the substrate W toward the edge thereof along the rotating direction of the substrate W by the centrifugal force as illustrated in FIG. 2. Thereafter, as illustrated in FIG. 3, the air flow 84 flows downward after colliding with the outer cup 12 and is exhausted from the inner space to the outside through the exhaust tube 70. As the direction of the air flow 84 is changed from the horizontal direction to the vertical direction, the air flow 84 collides with the outer cup 12, and a vortex is generated at the point where the air flow 84 collides with the outer cup 12. The air flow 84 is stagnant at the point where the vortex is generated, and the inner space is not smoothly evacuated accordingly. The problem is further intensified as the rotating speed of the substrate W is increased.

The vortex and the stagnant air flow at the collision point hamper the air flow over the edge region of the substrate W when a film of the treating liquid 82 is formed on the substrate W. Due to this, the thickness of the thin film on the edge region of the substrate W is greater than the thickness of the thin film on the central region of the substrate W. Furthermore, due to the vortex at the collision point, contaminants such as fumes flow back to the substrate W to contaminate the substrate W.

SUMMARY

Embodiments of the inventive concept provide a substrate treating apparatus for improving efficiency in treating a substrate.

Embodiments of the inventive concept provide a substrate treating apparatus for smoothly exhausting an air flow in a processing space when treating a substrate by supplying a treating liquid onto the rotating substrate in the treating space.

Embodiments of the inventive concept provide a substrate treating apparatus for forming a liquid film having a uniform thickness on the entire region of a substrate by supplying a treating liquid onto the rotating substrate.

Embodiments of the inventive concept provide a substrate treating apparatus for preventing re-adsorption of contaminants to a substrate when treating the substrate by supplying a treating liquid onto the rotating substrate.

The technical problems to be solved by the inventive concept are not limited to the aforementioned problems, and any other technical problems not mentioned herein will be clearly understood from the following description by those skilled in the art to which the inventive concept pertains.

An embodiment of the inventive concept provides a substrate treating apparatus.

The apparatus comprises: a processing container having an inner space; a support unit having a support plate configured to support and rotate the substrate in the inner space; a liquid supply unit configured to supply treating liquid to the substrate supported by the support unit; and an exhaust unit configured to exhaust an air flow in the inner space, wherein the processing container includes a bottom wall and a side wall extending from the outside end of the bottom wall, the processing container including a first gas-liquid separator provided at the side wall.

In an embodiment, the first gas-liquid separator includes a first part extending from the side wall and upwardly inclining toward a rotary shaft of the support unit, and a second part upwardly extending from a top end of the first part.

In an embodiment, the first gas-liquid separator includes a drain hole formed in the first part, and the drain hole is provided closer to the side wall of the processing container than to the second part.

In an embodiment, the processing container further includes a second gas-liquid separator provided at the bottom wall.

In an embodiment, the second gas-liquid separator is placed under and spaced apart from the first part of the first gas-liquid separator from the first part.

In an embodiment, the inner space includes a discharge space formed between the first gas-liquid separator and an outside region of the second gas-liquid separator, and an exhaust space formed between the first gas-liquid separator and an inner region space of the second gas-liquid separator, wherein the exhaust unit exhausting an air flow introduced into the exhaust space to the outside of the inner space.

In an embodiment, the air flow introduced into the discharge space is introduced into the exhaust space through the second gas-liquid separator.

In an embodiment, the support unit includes a rotatable support plate on which the substrate is placed, and the second part of the first gas-liquid separator is placed at a position lower the support plate.

In an embodiment, an air flow guide duct provided to introduce an air flow in a tangential direction to a rotation of the substrate supported by the support unit.

In an embodiment, the air flow guide part is located inside the inner space of the processing container.

In an embodiment, the air flow guide duct is provided between the second gas-liquid separator and an inner wall of the processing container.

In an embodiment, the air flow guide duct is provided with its lengthwise direction in an up/down direction, the air flow guide duct includes a top wall and a side wall, the top wall serving as a blocking face, an inlet formed at the side wall facing a direction parallel to a tangential line of the substrate supported by the support unit, the rest of the wall serving as a blocking face.

In an embodiment, a plurality of air flow guide ducts are placed apart in a circumferential direction of the substrate.

In an embodiment, the apparatus may further comprise: a fan unit supplying a downward air flow to the inner space; and a treating liquid nozzle supplying a treating liquid to the substrate supported by the support unit.

An embodiment of the inventive concept provides another substrate treating apparatus.

The apparatus comprises: a processing container having an inner space; a support unit having a support plate configured to support and rotate the substrate in the inner space; a liquid supply unit supplying treating liquid to the substrate supported by the support unit; and an exhaust unit exhausting an air flow in the inner space, wherein the processing container includes: an outer cup providing the inner space; an inner cup placed apart from the outer cup and placed in the inner space; a first gas-liquid separator provided at a side wall of the outer cup; and a second gas-liquid separator provided at the bottom wall of the outer cup.

In an embodiment, the first gas-liquid separator includes: a first part upwardly inclining and extending from the side wall of the outer cup in a direction of the rotary shaft of the support unit; and a second part upwardly extending from the top end of the first part.

In an embodiment, the inner cup comprises: an inner wall provided to surround the support unit; an outer wall provided to surround the inner wall; and a top wall connecting the top end of the inner wall and the top end of the outer wall, wherein the outer wall of the inner cup is placed apart from the second part of the first gas-liquid separator.

In an embodiment, the exhaust unit further includes an air flow guide duct placed between the inner cup and the outer cup and provided to introduce an air flow in a tangential direction to the rotation direction of the substrate supported by the support unit.

In an embodiment, the second gas-liquid separator is provided under the first part of the first gas-liquid, and placed apart from the first part, the inner space includes a exhaust space formed between the first gas-liquid separator and an outside region of second gas-liquid separator, and an exhaust space formed between the first gas-liquid separator and an inner region of the second gas-liquid separator, the exhaust unit exhausting an air flow introduced into the exhaust region to the outside of the inner space.

An embodiment of the inventive concept provides another substrate treating apparatus.

The apparatus comprises: a processing container having an inner space; a support unit having a support plate configured to support and rotate the substrate in the inner space; a liquid supply unit supplying a treating liquid to the substrate supported by the support unit; and an exhaust unit exhausting an air flow in the inner space, wherein the processing container includes: an outer cup providing the inner space; an inner cup placed apart from the outer cup and placed in the inner space, the processing container including: a first gas-liquid separator provided at a side wall of the outer cup; and a second gas-liquid separator provided at a bottom wall of the outer cup, the exhaust unit including an air guide duct placed between the inner cup and the outer cup, the air flow guide duct introducing an air flow in a tangential direction to a rotation direction of the substrate supported by the support unit.

According to the inventive concept, a treating liquid is supplied to a substrate rotating in an inner space of a processing container to smoothly exhaust an air flow in the inner space when the substrate is treated.

According to some embodiments of the inventive concept, when a treating liquid is supplied to a rotating substrate to form a liquid film on the substrate, the thickness of the liquid film may be uniformly formed in the entire region of the substrate.

According to the inventive concept, it is possible to prevent contaminants from being reattached to the substrate when treating the substrate by supplying a treating liquid to the rotating substrate.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
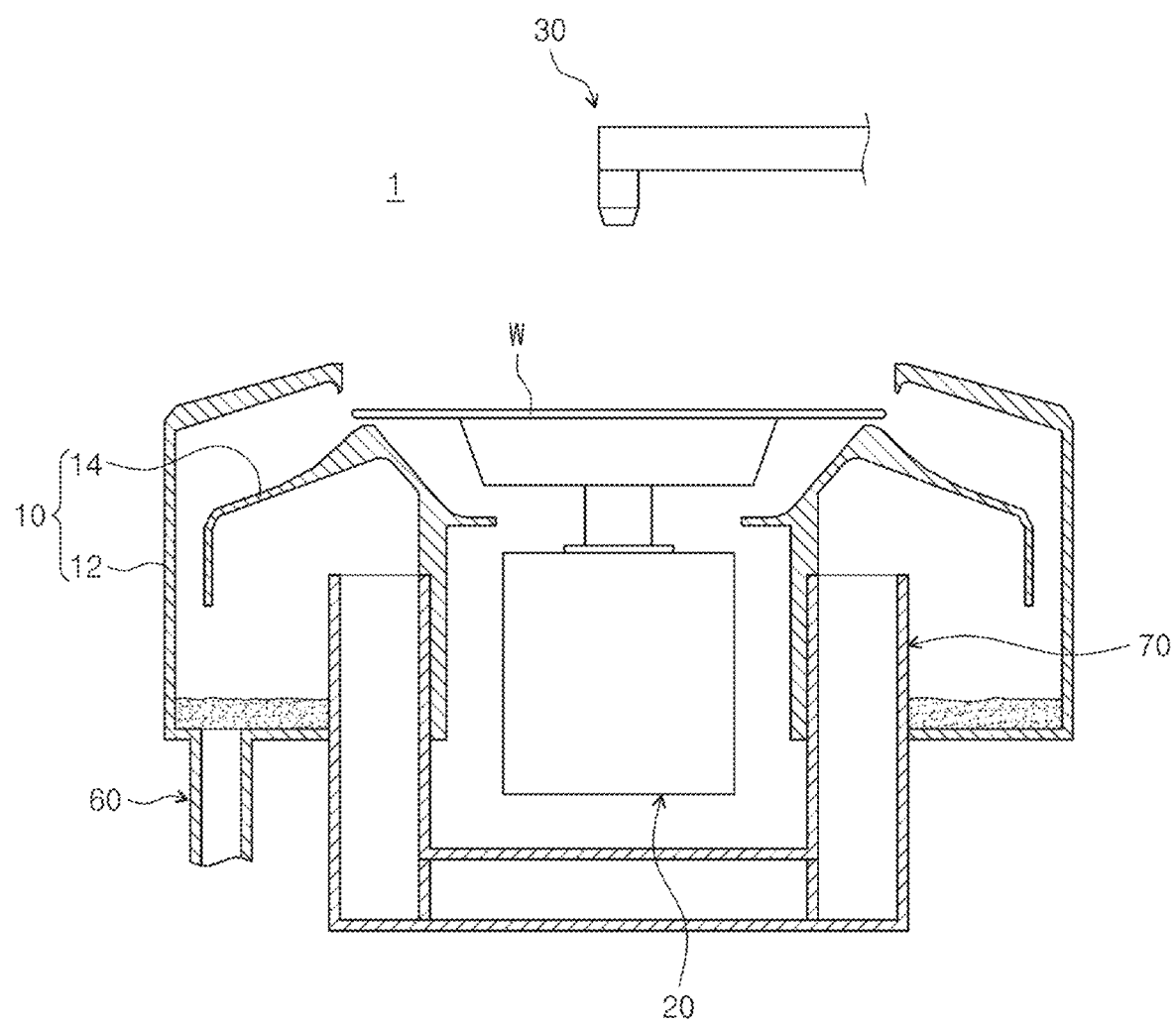
FIG. 1 is a sectional view illustrating a substrate treating apparatus having a general structure for performing a liquid treatment on a substrate while rotating the substrate.
Figure 2:
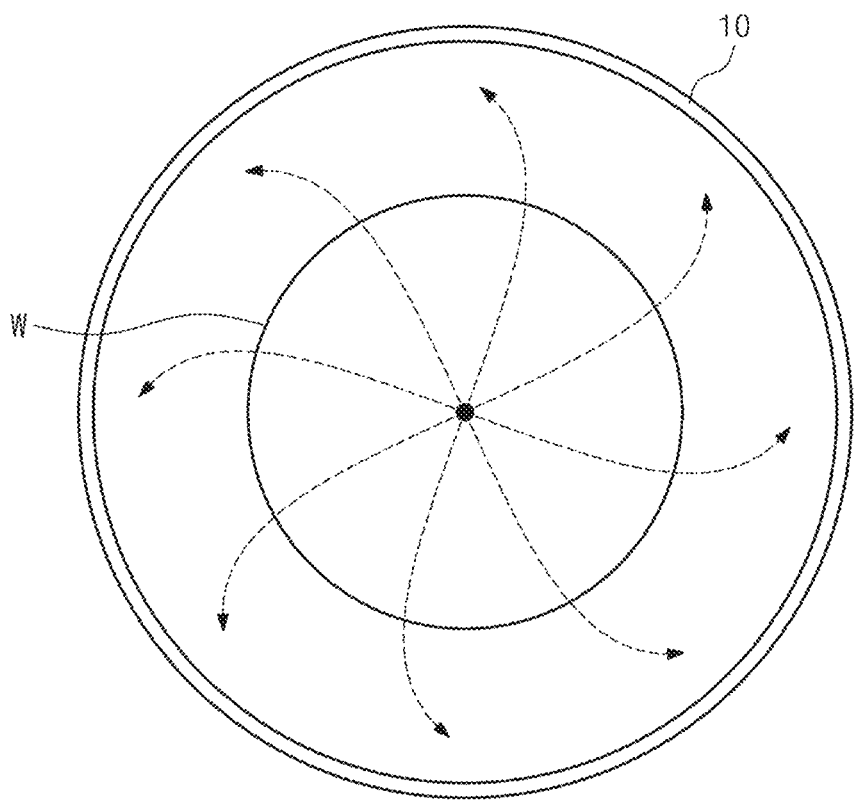
FIG. 2 is a plan view illustrating a direction of an air flow on a surface of the substrate in the substrate treating apparatus of FIG. 1.
Figure 3:
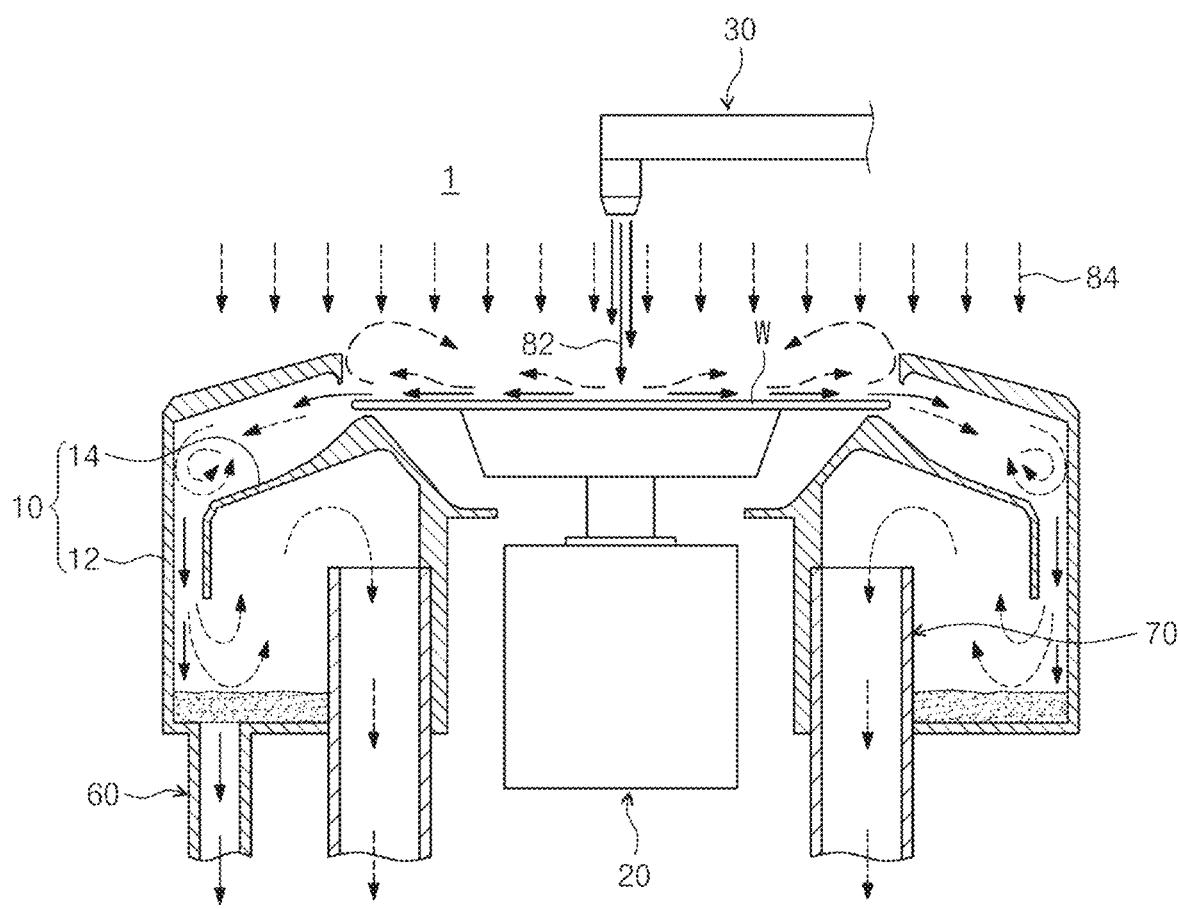
FIG. 3 is a sectional view illustrating the air flow in the substrate treating apparatus of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be exaggerated or omitted when it may make the essence of the inventive concept unclear.

An apparatus of this embodiment may be used to perform a photolithography process on a circular substrate. In particular, the apparatus of this embodiment may be connected to an exposure apparatus and may be used to perform a coating process and a developing process on a substrate. However, the spirit and scope of the inventive concept is not limited thereto, and the apparatus may be used to perform various types of processes of supplying a treating liquid onto a substrate while rotating the substrate. In the following description, it will be exemplified that a wafer is used as a substrate.

Hereinafter, an embodiment of the inventive concept will be illustrated with reference to FIG. 4 to FIG. 17.

Figure 4:
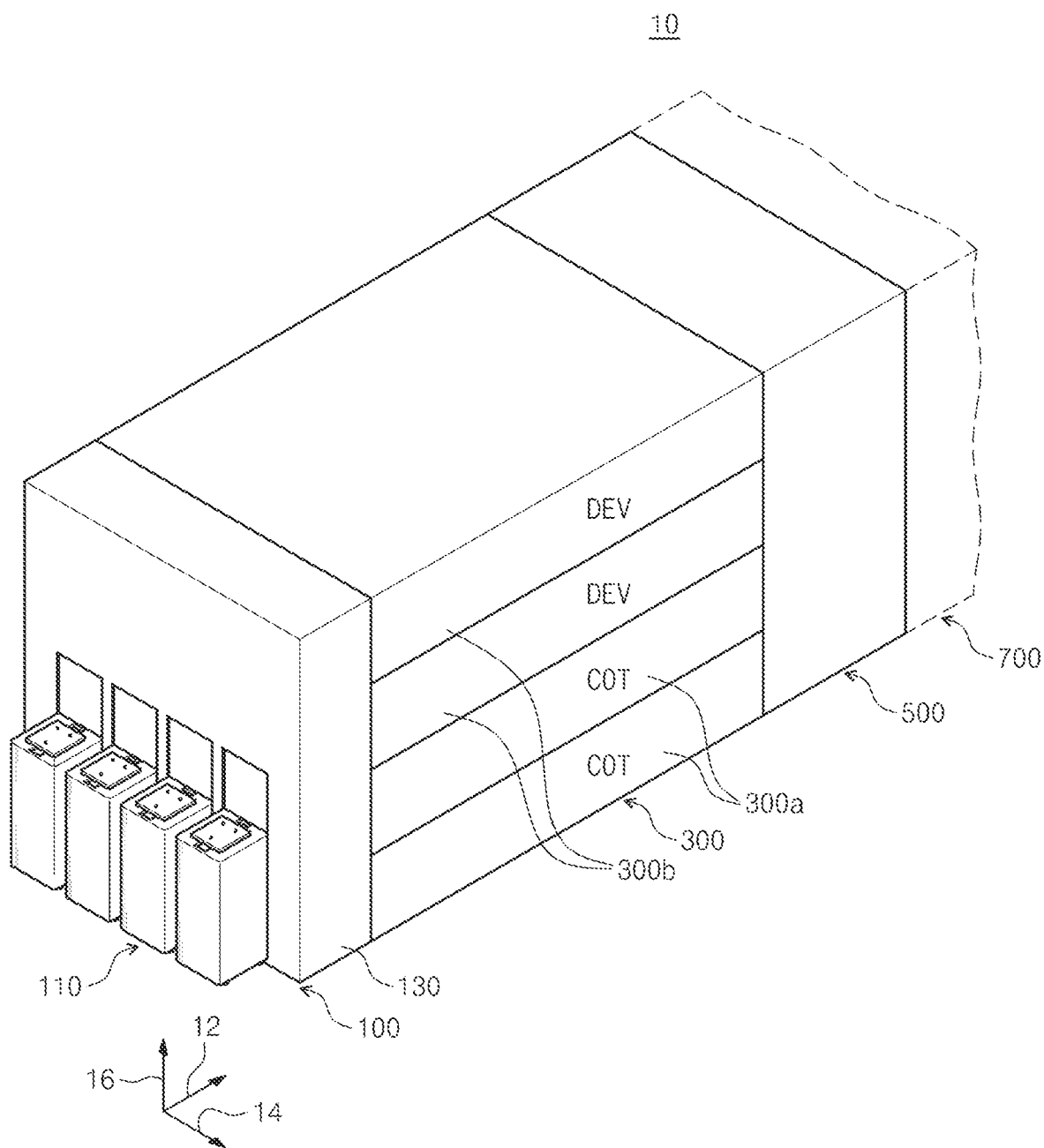
FIG. 4 is a schematic perspective view illustrating the substrate treating apparatus according to an embodiment of the inventive concept.
Figure 5:
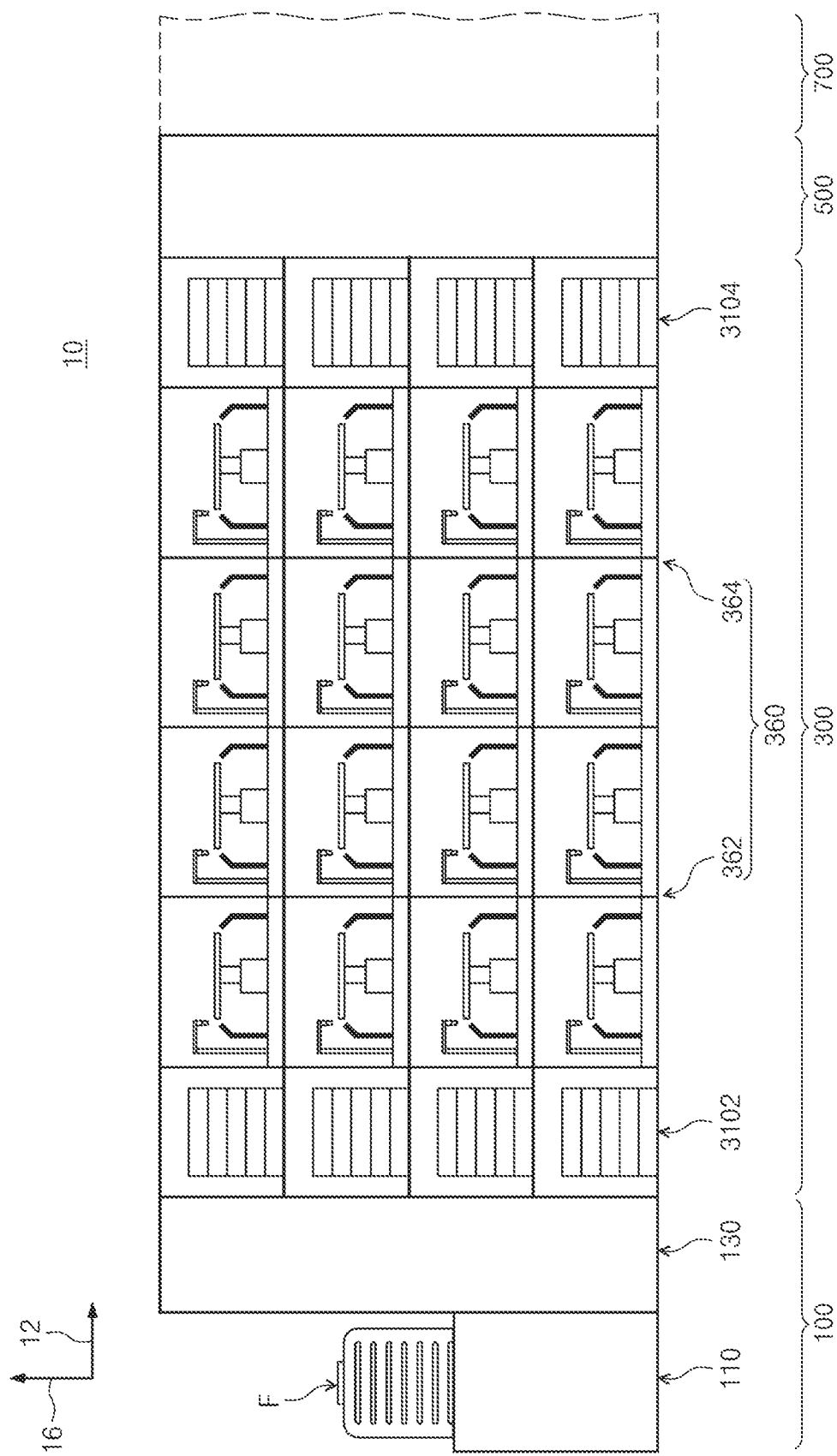
FIG. 5 is a sectional view of the substrate treating apparatus illustrating coating blocks and developing blocks of FIG. 4.
Figure 6:
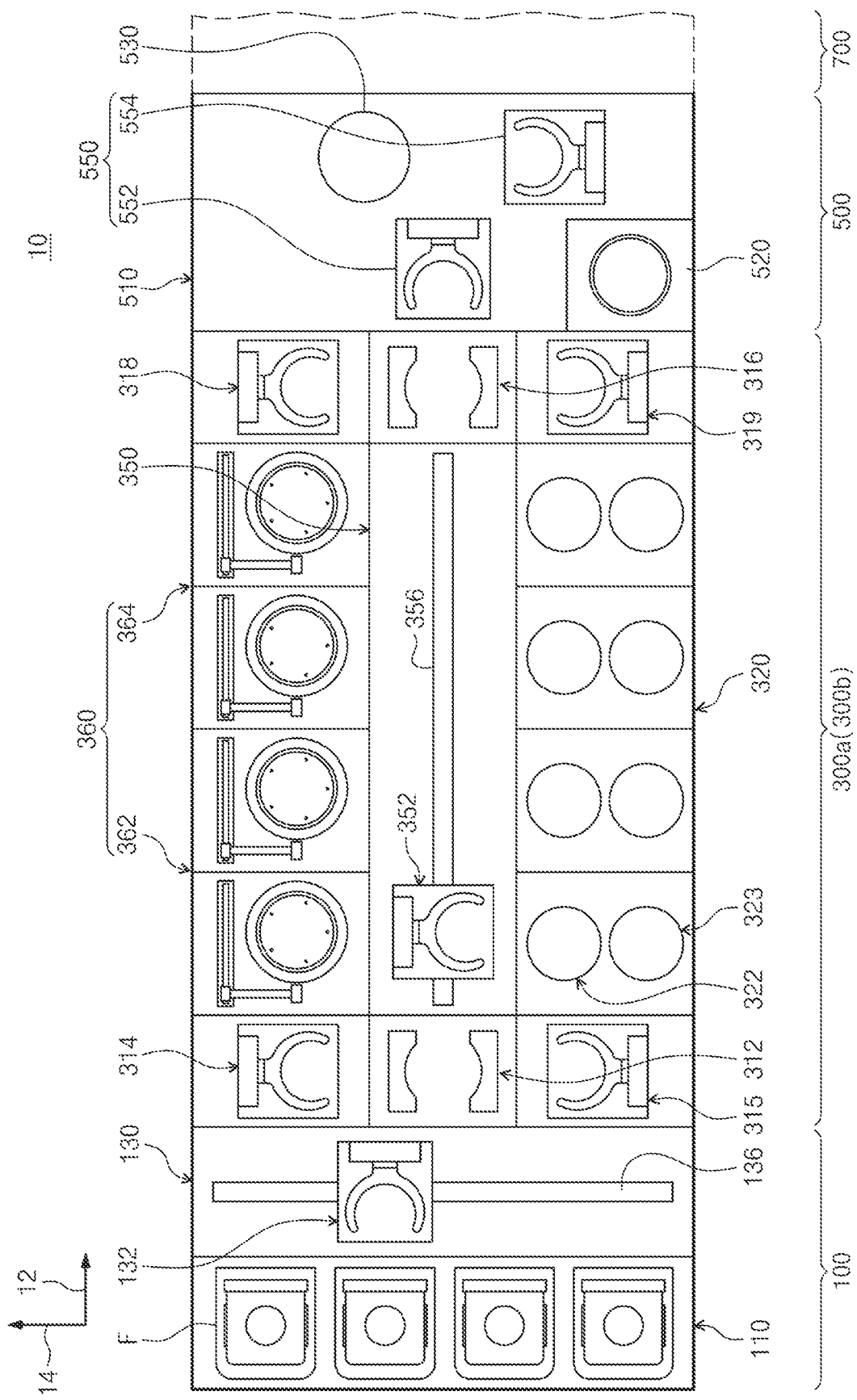
FIG. 6 is a plan view of the substrate treating apparatus of FIG. 1.

FIG. 4 illustrates a substrate treating apparatus according to an embodiment of the inventive concept, FIG. 5 illustrates a coating block or a developing block of FIG. 4, and FIG. 6 shows the substrate treating apparatus of FIG. 4.

Referring to FIG. 4 to FIG. 6, the substrate treating apparatus 10 according to an embodiment of the inventive concept comprises an index module 100, a processing module 300, and an interface module 500. According to an embodiment, the index module 100, the processing module 300, and the interface module 500 are sequentially arranged in a row. Hereinafter, a direction in which the index module 100, the processing module 300, and the interface module 500 are arranged will be referred to as a first direction 12, a direction that is perpendicular to the first direction when viewed from above will be referred to as a second direction 14, and a direction that is perpendicular to both the first direction 12 and the second direction 14 will be referred to as a third direction 16.

The index module 100 transfers the substrate W from the container F in which the substrate W is stored to the processing module 300, and gets the processed substrate W from the processing module 300 to be stored in the container F. The index module 100 is provided with its length extending along the second direction 14. The index module 100 has a load port 110 and an index frame 130. The index frame 130 is placed between the load port 110 and the processing module 300. The container F in which the substrates W are stored is placed at the load port 110. A plurality of load ports 110 may be provided, and the plurality of load ports 110 may be placed along the second direction 14.

For the container F, a closing-type container F such as a front open unified pod (FOUP) can be used. The container F can be placed on the load port 110 by a transfer means (not shown) such as an overhead transfer, an overhead conveyor, or an automatic guided vehicle, or the container F may be placed on the load port 110 by an operator.

An index robot 132 is provided inside the index frame 130. In the index frame 130, a guide rail 136 is provided with its length extending along the second direction 14, and the index robot 132 may be provided movable on the guide rail 136. The index robot 132 includes a hand on which the substrate W is placed, and the hand may be provided to be forwardly and backwardly movable, rotatable with the third direction 16 as an axis, and movable along the third direction 16.

The processing module 300 may perform a coating process and a developing process on the substrate W. The processing module 300 may receive the substrate W stored in the container F and perform a substrate treating process. The processing module 300 has a coating block 300*a* and a developing block 300*b*. The coating block 300*a* performs a coating process on the substrate W, and the developing block 300*b* performs a developing process on the substrate W. A plurality of the coating blocks 300*a* are provided, and the plurality of coating blocks 300*a* are provided to be stacked one above another. A plurality of the developing blocks 300*b* are provided, and the plurality of developing blocks 300*b* are provided to be stacked one above another. According to an embodiment of FIG. 4, two coating blocks 300*a* are provided, and two developing blocks 300*b* are provided. The coating blocks 300*a* may be disposed under the developing blocks 300*b*. In an embodiment, the two coating blocks 300*a* perform the same process and may be provided in the same structure. In addition, the two developing blocks 300*b* perform the same process and may be provided in the same structure.

Referring to FIG. 6, the coating block 300*a* includes a heat treatment chamber 320, a transfer chamber 350, a liquid treatment chamber 360, and buffer chambers 312 and 316. The heat treatment chamber 320 may be chambers for performing a heat treatment process on the substrate W. The heat treatment process may include a cooling process and a heating process. The liquid treatment chamber 360 supplies liquid onto the substrate W to form a liquid layer. The liquid layer may be a photoresist film or an anti-reflection film. The transfer chamber 350 transfers the substrate W between the heat treatment chamber 320 and the liquid treatment chamber 360 in the coating block 300*a*.

The transfer chamber 350 is provided is provided such that its lengthwise direction is parallel to an up/down direction. A transfer robot 352 is provided in the transfer chamber 350. The transfer robot 352 transfers the substrate among the heat treatment chamber 320, the liquid treatment chamber 360, and the buffer chambers 312 and 316. In an embodiment, the transfer robot 352 has a hand on which the substrate W is placed, and the hand may be provided to be forwardly and backwardly movable, rotatable with the third direction 16 as an axis, and movable along the third direction 16. A guide rail 356 is provided in the transfer chamber 350 such that its lengthwise direction is parallel to the first direction, and the transfer robot 352 may be provided to be movable on the guide rail 356.

Figure 7:
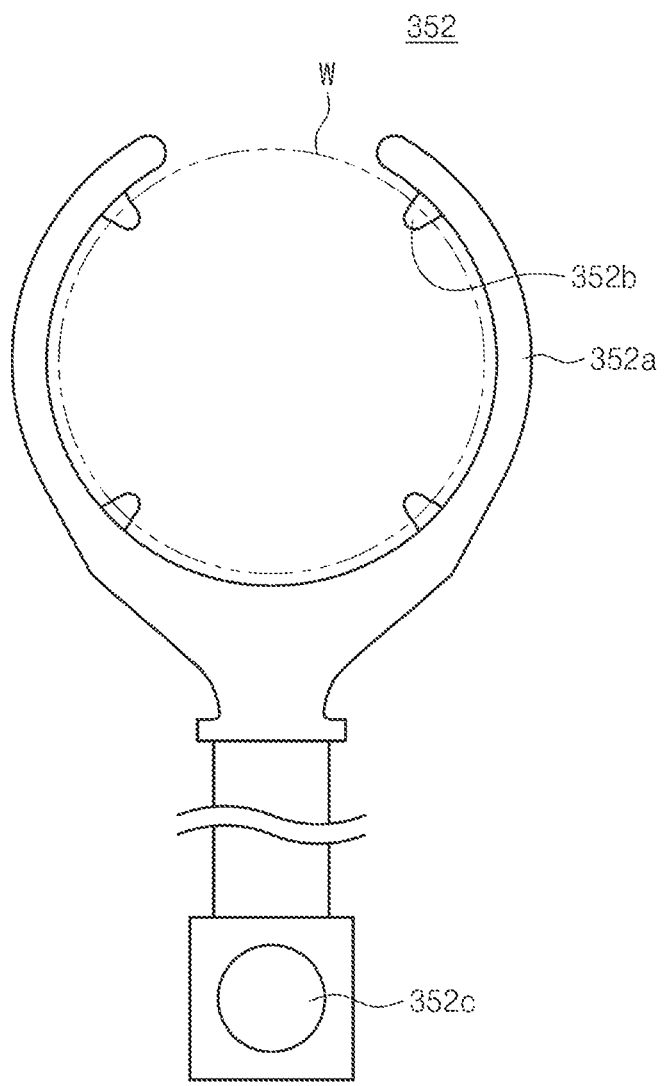
FIG. 7 is a schematic plan view illustrating a transfer robot of FIG. 6.

FIG. 7 illustrates an example of a hand of a transfer robot. Referring to FIG. 7, the hand 352 has a base 352a and a support protrusion 352b. The base 352a may have an annular ring shape in which a part of the circumference is bent. The base 352a has an inner diameter larger than the diameter of the substrate W. The support protrusion 352b extends inward from the base 352a. A plurality of support protrusions 352b are provided and support an edge region of the substrate W. According to an embodiment, four support protrusions 352b may be provided at equal intervals.

A plurality of heat treatment chambers 320 are provided. The heat treatment chambers 320 are arranged along the first direction 12. The heat treatment chambers 320 are placed on one side of the transfer chamber 350.

Figure 8:
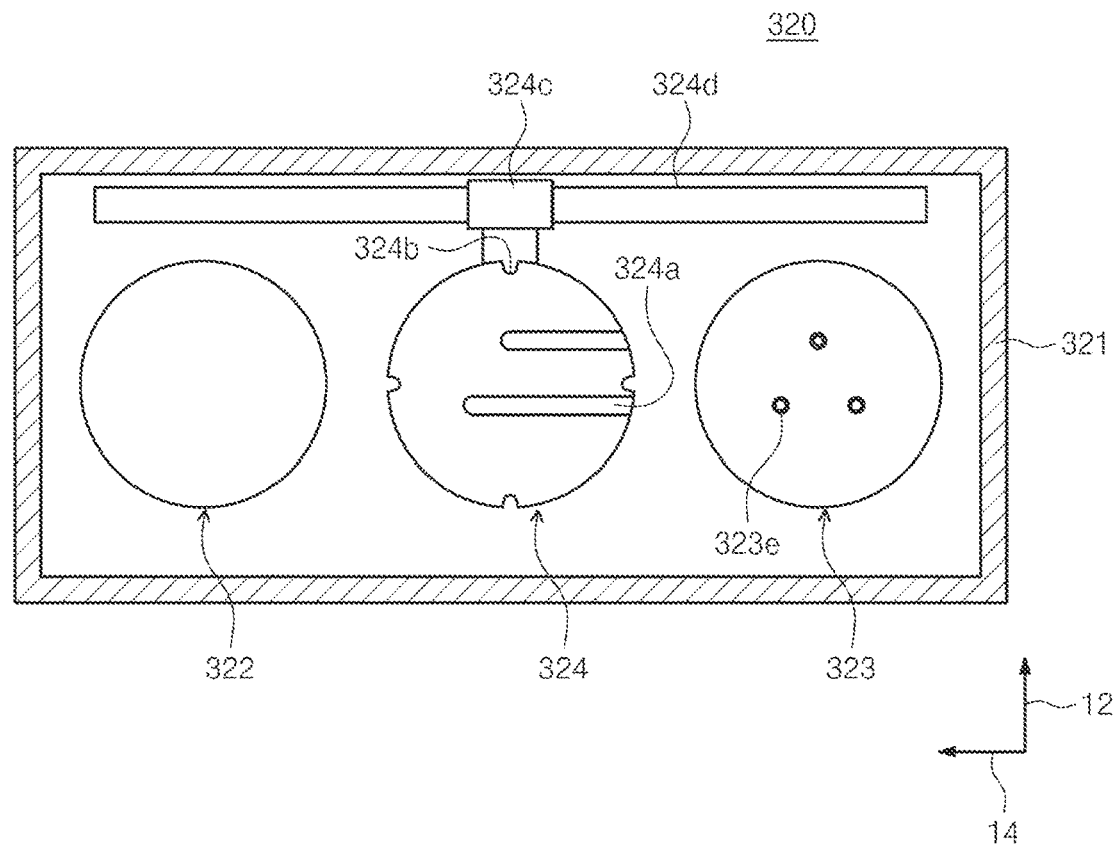
FIG. 8 is a schematic plan view illustrating one example of heat treatment chambers of FIG. 6.
Figure 9:
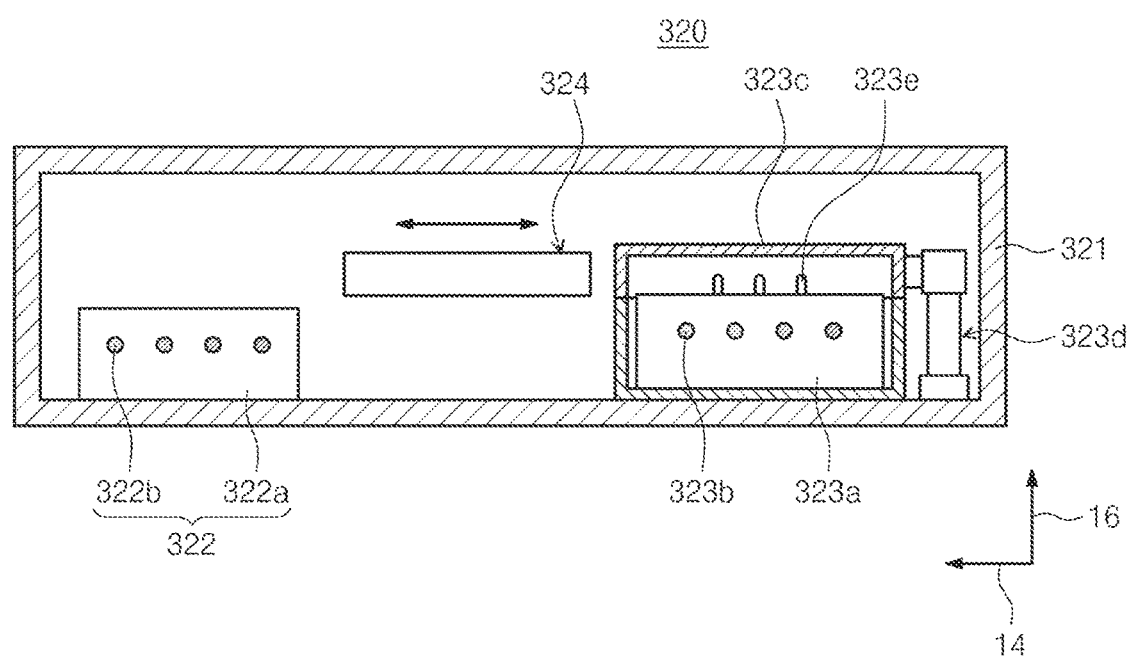
FIG. 9 is a front view of the heat treatment chamber of FIG. 6.

FIG. 8 shows the heat treatment chamber of FIG. 6, and FIG. 9 shows the heat treatment chamber of FIG. 8 according to an embodiment of the inventive concept.

Referring to FIG. 8 and FIG. 9, the heat treatment chamber 320 includes a housing 321, a cooling unit 322, a heating unit 323, and a transfer plate 324.

The housing 321 is provided in a substantially rectangular parallelepiped shape. An inlet (not shown) through which the substrate W enters and exits is provided on the sidewall of the housing 321. The inlet may remain open. Selectively, a door (not shown) may be provided to open and close the inlet. The cooling unit 322, the heating unit 323, and the transfer plate 324 are provided in the housing 321. The cooling unit 322 and the heating unit 323 are provided side by side along the second direction 14. In an embodiment, the cooling unit 320 may be placed closer to the transfer chamber 350 than the heating unit 323.

The cooling unit 322 has a cooling plate 322a. The cooling plate 322a may have a substantially circular shape when viewed from above. The cooling plate 322a is provided with a cooling member 322b. In an embodiment, the cooling member 322b is formed inside the cooling plate 322a and may be provided as a passage through which the cooling fluid flows.

The heating unit 323 has a heating plate 323a, a cover 323c, and a heater 323b. The heating plate 323a has a generally circular shape when viewed from above. The heating plate 323a has a larger diameter than the substrate W. The heating plate 323a is equipped with a heater 323b. The heater 323b may be implemented with a resistance heating element to which an electric current is applied. The heating plate 323a is provided with lift pins 323e that may be vertically movable along the third direction 16. The lift pins 323e receive the substrate W from the transfer means outside the heating unit 323 and place the substrate W down on the heating plate 323a or raise the substrate W off the heating plate 323a and transfer the substrate W to the transfer means outside the heating unit 323. In an embodiment, three lift pins 323e may be provided. The cover 323c has a space therein, which is open at the bottom. The cover 323c is located over the heating plate 323a and is moved in an up/down direction by the driver 323d. A space formed together with the heating plate 323a by moving the cover 323c serves as a heating space in which the substrate W is heated.

The transfer plate 324 has a substantially circular shape and has a diameter corresponding to that of the substrate W. A notch 324b is formed at an edge of the transfer plate 324. The notch 324b may have a shape corresponding to the protrusion 352b formed on the hand 354 of the transfer robot 352. In addition, as many notches 324b as the protrusion 352b formed on the hand 354 are formed in a position corresponding to the protrusions 352b. When the vertically aligned positions of the hand 354 and the transfer plate 324 are changed in the vertical direction, the substrate W is transferred between the hand 354 and the transfer plate 324. The transfer plate 324 may be mounted on the guide rail 324d and is movable along the guide rail 324d by the driver 324c. A plurality of guide grooves 324a in a slit shape are provided in the transfer plate 324. The guide grooves 324a inwardly extends from the edge of the transfer plate 324 into the inside of the transfer plate 324. The guide grooves 324a are provided with their length extending along the second direction 14, and the guide grooves 3242 are located to be spaced apart from each other along the second direction 14. The guide grooves 324a prevent the transfer plate 324 and the lift pin 323e from interfering with each other when the substrate W is handed over between the transfer plate 324 and the heating unit 323.

The substrate W is cooled in a state in which the transfer plate 324 having the substrate W placed thereon is brought into contact with the cooling plate 322a. For efficient heat transfer between the cooling plate 322a and the substrate W, the transfer plate 324 is formed of a material having high heat conductivity. In an embodiment, the transfer plate 324 may be formed of a metallic material.

The heating unit 323 provided in some of the heat treatment chambers 320 may supply gas while heating the substrate W to improve the adhesion of the photoresist to the substrate W. In an embodiment, the gas may be hexamethyldisilane (HMDS) gas.

A plurality of liquid treatment chambers 360 are provided. Some of the liquid treatment chambers 360 may be stacked one above another. The liquid treatment chambers 360 are located on one side of the transfer chamber 350. The liquid treatment chambers 360 are arranged side by side along the first direction 12. Some of the liquid treatment chambers 360 are located adjacent to the index module 100. Hereinafter, these liquid treatment chambers 360 are referred to as front liquid treatment chambers 362. Some other liquid treatment chambers 360 are located adjacent to the interface module 500. Hereinafter, these liquid treatment chambers 360 are referred to as rear liquid treatment chambers 364.

Each of the front liquid treatment chambers 362 applies a first liquid onto the substrate W, and each of the rear liquid treatment chambers 364 applies a second liquid onto the substrate W. The first liquid and the second liquid may be different types of liquid. In an embodiment, the first liquid may be a liquid for forming an anti-reflection layer, and the second liquid may be a liquid for forming a photoresist layer. The photoresist liquid may be applied onto the substrate W coated with the anti-reflection film. Selectively, the first liquid may be a photoresist liquid, and the second liquid may be a liquid for forming an anti-reflection layer. In this case, the liquid for forming the anti-reflection layer may be applied onto the substrate W coated with photoresist layer. Selectively, the first liquid and the second liquid may be the same kind of liquid, and both the first liquid and the second liquid may be liquids for forming photoresist layer.

The developing block 300b has a same structure with the coating block 300a, and the liquid treatment chamber provided to the developing block 300b supplies a developing solution to the substrate W.

The interface module 500 connects the processing module 300 with an external exposure apparatus 700. The interface module 500 has an interface frame 510, an additional process chamber 520, an interface buffer 530, and an interface robot 550.

A fan filter unit that forms a downward air flow may be provided at a top end of the interface frame 510. The additional process chamber 520, the interface buffer 530, and the interface robot 550 are disposed within the interface frame 510. The additional process chamber 520 may perform a predetermined additional process before the substrate W treated in the coating block 300a is transferred to the exposure apparatus 700. Selectively, the additional process chamber 520 may perform a predetermined additional process before the substrate W treated in the exposure apparatus 700 is transferred to the developing block 300b. In an embodiment, the additional process may be an edge exposing process of exposing the edge region of the substrate W, a top side cleaning process of cleaning the top side of the substrate W, or a backside cleaning process of cleaning the backside of the substrate W. A plurality of additional process chambers 520 may be provided, and the additional process chambers 520 may be stacked one above another. All of the additional process chambers 520 may be provided to perform the same process. Selectively, some of the additional process chambers 520 may be provided to perform different processes.

The interface buffer 530 provides a space in which the substrate W transferred between the coating block 300a, the additional process chamber 520, the exposure apparatus 700, and the developing block 300b temporarily stays while being transferred. A plurality of interface buffers 530 may be provided, and the plurality of interface buffers 530 may be stacked one above another.

In an embodiment, the additional process chambers 520 may be disposed on one side of an extension line facing the lengthwise direction of the transfer chamber 350, and the interface buffer 530 may be disposed on an opposite side of the extension line.

The interface robot 550 transfers the substrate W between the coating block 300a, the additional process chamber 520, the exposure apparatus 700, and the developing block 300b. The interface robot 550 may have a transfer hand for transferring the substrate W. One or a plurality of the interface robot 550 may be provided. In an embodiment, the interface robot 550 has a first robot 552 and a second robot 554. The first robot 552 may be provided to transfer the substrate W between the coating block 300a, the additional process chamber 520, and the interface buffer 530, and the second robot 554 may transfer the substrate W between the interface buffer 530 and the exposure apparatus 700, and the second robot 554 may transfer the substrate W between the interface buffer 530 and the developing block 300b.

Each of the first robot 552 and the second robot 554 includes a transfer hand on which the substrate W is placed, and the hand may be provided to be movable forwardly and backwardly, rotatable with respect to an axis parallel to the third direction 16, and movable along the third direction 16.

Hereinafter, a structure of a substrate treating apparatus for treating the substrate by supplying the treating liquid onto the rotating substrate among substrate treating apparatuses of the inventive concept will be described in detail. It will be exemplified that the substrate treating apparatus is an apparatus for applying photoresist. However, the substrate treating apparatus may be an apparatus for forming a film, such as a protective film or an anti-reflection film, on a rotating substrate W. Selectively, the substrate treating apparatus may be an apparatus for supplying a treating liquid 82, such as a developing solution, onto a substrate W.

Figure 10:
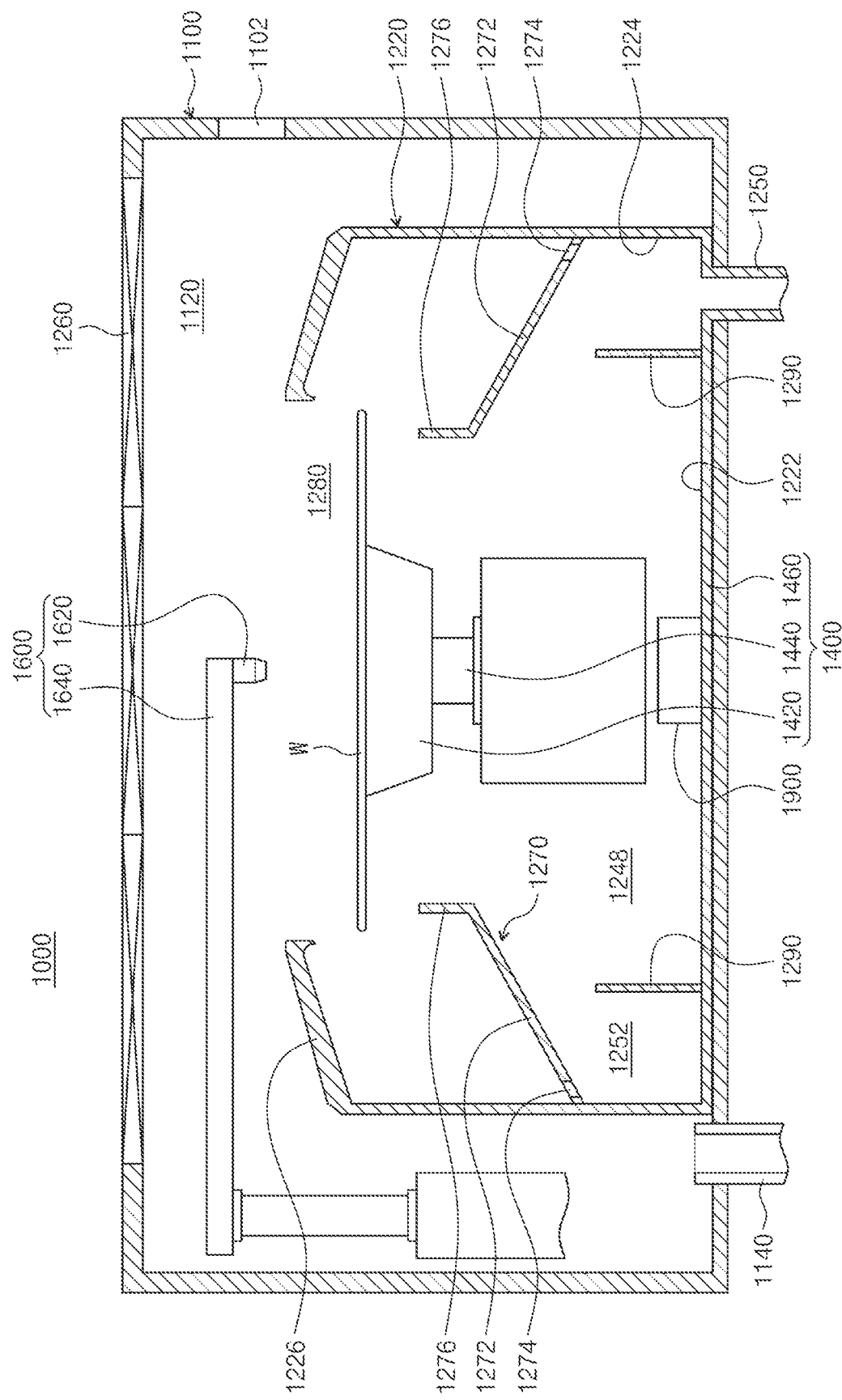
FIG. 10 is a schematic sectional view illustrating a structure of the substrate treating apparatus for treating the substrate by supplying a liquid onto a rotating substrate according to a first embodiment of the inventive concept.
Figure 11:
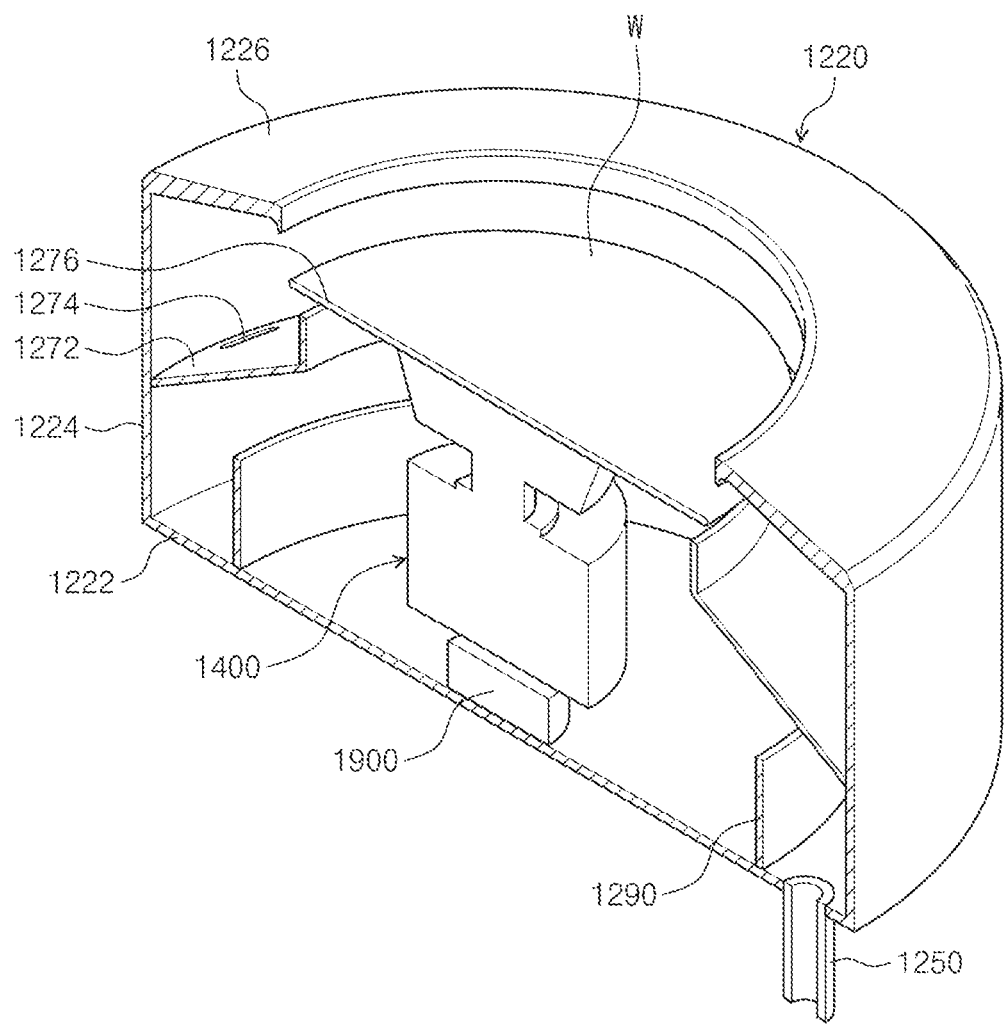
FIG. 11 is a sectional perspective view of the substrate treating apparatus of FIG. 10.

FIG. 10 illustrates an embodiment of the substrate treating apparatus for treating the substrate by supplying the treating liquid onto the rotating substrate, and FIG. 11 illustrates the substrate treating apparatus of FIG. 10.

Referring to FIG. 10 and FIG. 11, the substrate treating apparatus includes a housing 1100, a processing container 1200, a support unit 1400, a liquid supply unit 1600, and an exhaust unit 1900.

The housing 1100 may be provided in a rectangular container shape having an inner space 1120. An opening 1102 may be formed in a sidewall of the housing 1100. The opening 1102 may function as an entrance/exit opening through which the substrate W enters and exits the housing 1100. A door (not shown) may be provided on the sidewall of the housing 1100 and opens and closes the opening 1102.

The processing container 1200 may be disposed in the inner space 1120 of the housing 1100. The processing container 1200 has an inner space 1280. The inner space 1280 is open at the top.

The support unit 1400 supports the substrate W in the inner space 1280 of the processing container 1200. The support unit 1400 has a support plate 1420, a rotary shaft 1440, and a driver 1460. The support plate 1420 has a circular top surface. The support plate 1420 has a smaller diameter than the substrate W. The support plate 1420 supports the substrate W by vacuum pressure. Selectively, the support plate 1420 may have a mechanical clamping structure that supports the substrate W. The rotary shaft 1440 is coupled to the center of the bottom surface of the support plate 1420, and the driver 1460 providing torque to the rotary shaft 1440 is coupled to the rotary shaft 1440. The driver 1460 may be a motor.

The liquid supply unit 1600 supplies the treating liquid 82 onto the substrate W. The treating liquid 82 may be a coating solution such as photoresist. The liquid supply unit 1600 has a nozzle 1620, a nozzle moving member 1640, and a liquid supply source (not shown). The nozzle 1620 may include one or a plurality of nozzles. The nozzle 1620 supplies the treating liquid 82 onto the substrate W. The nozzle 1620 is supported on the nozzle moving member 1640. The nozzle moving member 1640 moves the nozzle 1620 between a process position and a standby position. In the process position, the nozzle 1620 supplies the treating liquid 82 onto the substrate W placed on the support plate 1420. After completely supplying the treating liquid 82, the nozzle 1620 stands by in the standby position. In the standby position, the nozzle 1620 stands by in a home port (not shown). The home port is located outside of the processing container 1200 in the housing 1100.

A fan filter unit 1260 is disposed inside a top wall of the housing 1100 and supplies a downward air flow 84 into the inner space 1120. The fan filter unit 1260 has a fan that introduces outside air into the inner space 1120 and a filter that filters the outside air.

An exhaust tube 1140 is connected to the housing 1100 so as to be located outward of the processing container 1200 and exhausts, to the outside, the air flow 84 supplied into the space between the processing container 1200 and the housing 1100.

The processing container 1200 may include an outer cup 1220.

The outer cup 1220 may be provided to surround the support unit 1400 and the substrate W supported on the support unit 1400. The outer cup 1220 has a bottom wall 1222, a sidewall 1224, and a top wall 1226. The inside of the outer cup 1220 is provided as the inner space 1280 described above. The inner space 1280 includes the processing space in a top region and an exhaust space 1248 in a lower space.

The bottom wall 1222 has a circular shape and has an opening in the center thereof. The sidewall 1224 upwardly extends from the outside end of the bottom wall 1222. The sidewall 1224 has a ring shape and is perpendicular to the bottom wall 1222. According to an embodiment, the sidewall 1224 extends to a height equal to or slightly lower than the height of the top surface of the support plate 1420. The top wall 1226 has a ring shape and has an opening in the center thereof. The top wall 1226 inclining and upwardly extending from the top end of the sidewall 1224 toward the central axis of the outer cup 1220.

A part of the processing space under the support plate 1420 may be provided as the exhaust space 1248. According to an embodiment, the exhaust space 1248 may be provided as a bottom region of a first gas-liquid separator to be described later. According to an embodiment, the exhaust space 1248 may be provided as an inner region of a second gas-liquid separation plate 1290 to be described later among a bottom region of a first gas-liquid separation plate 1270 to be described later. According to an embodiment, the exhaust space 1248 may be defined as a space formed between the first gas-liquid separation plate 1270 and an inner region of the second gas-liquid separation plate 1290.

A gas-liquid separation plate may be provided in the inner space 1280 of the processing container 1200. The gas-liquid separation plate may include the first gas-liquid separation plate 1270 provided on the sidewall 1224 of the outer cup 1220. The first gas-liquid separation plate 1270 may protrude inward from the sidewall 1224 of the outer cup 1220. The first gas-liquid separation plate 1270 may extend in a circumferential direction along the inner surface of the sidewall 1224 of the outer cup 1220. The first gas-liquid separation plate 1270 may include a first part 1272 upwardly extending from an inner surface of the side wall 1224 of the outer cup 1220 toward the rotary shaft 1440 of the support unit 1400, and a second part 1276 upwardly extending from a top end of the first part 1272. According to an embodiment, the first part 1272 of the first gas-liquid separation plate 1270 is disposed to be downwardly inclining as it moves away from the rotary shaft 1440 such that an inner end thereof is positioned higher than an outer end thereof. A drain hole 1274 is formed in a region of the first gas-liquid separation plate 1270 adjacent to the sidewall 1224 of the outer cup 1220. A plurality of drain holes 1274 are provided along a lengthwise direction of the first part 1272 of the first gas-liquid separation plate 1270. Accordingly, the treating liquid 82 introduced into a top region of the first gas separation plate 1270 together with the air flow 84 of the treating liquid 82 supplied onto the substrate W rotating from the nozzle 1620 may be introduced into the exhaust space 1252 through the drain hole 1274. The second part 1276 extends parallel to the rotary shaft 1440. The second part 1276 is positioned at a position lower than the substrate W supported by the support unit 1400. The second part 1276 is positioned at a position lower than the support plate 1420. The second part 1276 is spaced apart from the support unit 1400. Accordingly, the air flow 84 flowing into the space between the second part 1276 of the first gas-liquid separation plate 1270 and the support unit 1400 flows into the exhaust space 1248. The air flow 84 introduced into the top region of the first gas-liquid separation plate 1270 may be introduced into the exhaust space 1248 beyond the second part 1276.

The gas-liquid separation plate may include the second gas-liquid separation plate 1290 provided to the bottom wall 1222 of the outer cup 1220. The second gas-liquid separation plate 1290 may be provided to upwardly extend from the bottom wall 1222 of the outer cup 1220. The second gas-liquid separation plate 1290 may be provided in a ring shape. The second gas-liquid separation plate 1290 may be positioned between the sidewall 1224 of the outer cup 1220 and the support unit when viewed from above. The second gas-liquid separation plate 1290 may be disposed under the first part 1272 of the first gas-liquid separation plate 1270. The second gas-liquid separation plate 1290 may be disposed below the first part 1272 of the first gas-liquid separation plate 1270. The second gas-liquid separation plate 1290 may be spaced apart in an up/down direction from the first gas-liquid separation plate 1270. Accordingly, the airflow 84 passing through the drain hole 1274 together with the treating liquid 82 may be introduced into the exhaust space 1248 beyond the second gas separation plate 1276.

A drain tube 1250 for draining the treating liquid 82 is connected to the bottom wall 1222 of the outer cup 1220. The drain tube 1250 drains, outside the processing container 1200, the treating liquid 82 introduced between the sidewall 1224 of the outer cup 1220 and the outer wall 1244 of the inner cup 1240. According to an embodiment, a space between the sidewall 1224 of the outer cup 1220 and the second gas-liquid separator 1290 is provided as a drain space 1252 for draining the treating liquid 82, and the drain tube 1250 drains the treating liquid 82 from the drain space 1252. In this process, the treating liquid 82 contained in the air flow 84 flowing through the drain hole 1274 of the first gas-liquid separator is drained outside the processing container 1200 from the drain space 1252 through the drain tube 1250, and the air flow 84 is introduced into the exhaust space 1248 of the processing container 1200.

One or a plurality of drain tubes 1250 may be provided. When a plurality of drain tubes 1250 are provided, the drain tubes 1250 may be arranged along the circumferential direction of the outer cup 1220.

Although not shown, a lifting/lowering driver for adjusting the height of the outer cup 1220 relative to the support plate 1420 may be provided. According to an embodiment, the lifting/lowering driver may move the outer cup 1220 in an up/down direction. For example, the support plate 1420 is located in a higher position than the top end of the outer cup 1220 to prevent interference between a transfer member for transferring the substrate W and the outer cup 1220 when the substrate W is loaded onto or unloaded from the support plate 1420. Furthermore, when a process is performed, the support plate 1420 is located in a lower height than the top end of the outer cup 1220 such that the substrate W is located within the processing space.

The exhaust unit 1900 may include an exhaust pipe 1800.

A pressure adjustment member (not shown) is installed at the exhaust pipe 1800 to suck the air flow 84 within the exhaust space 1248. The pressure adjustment member may be a pump.

Figure 12:
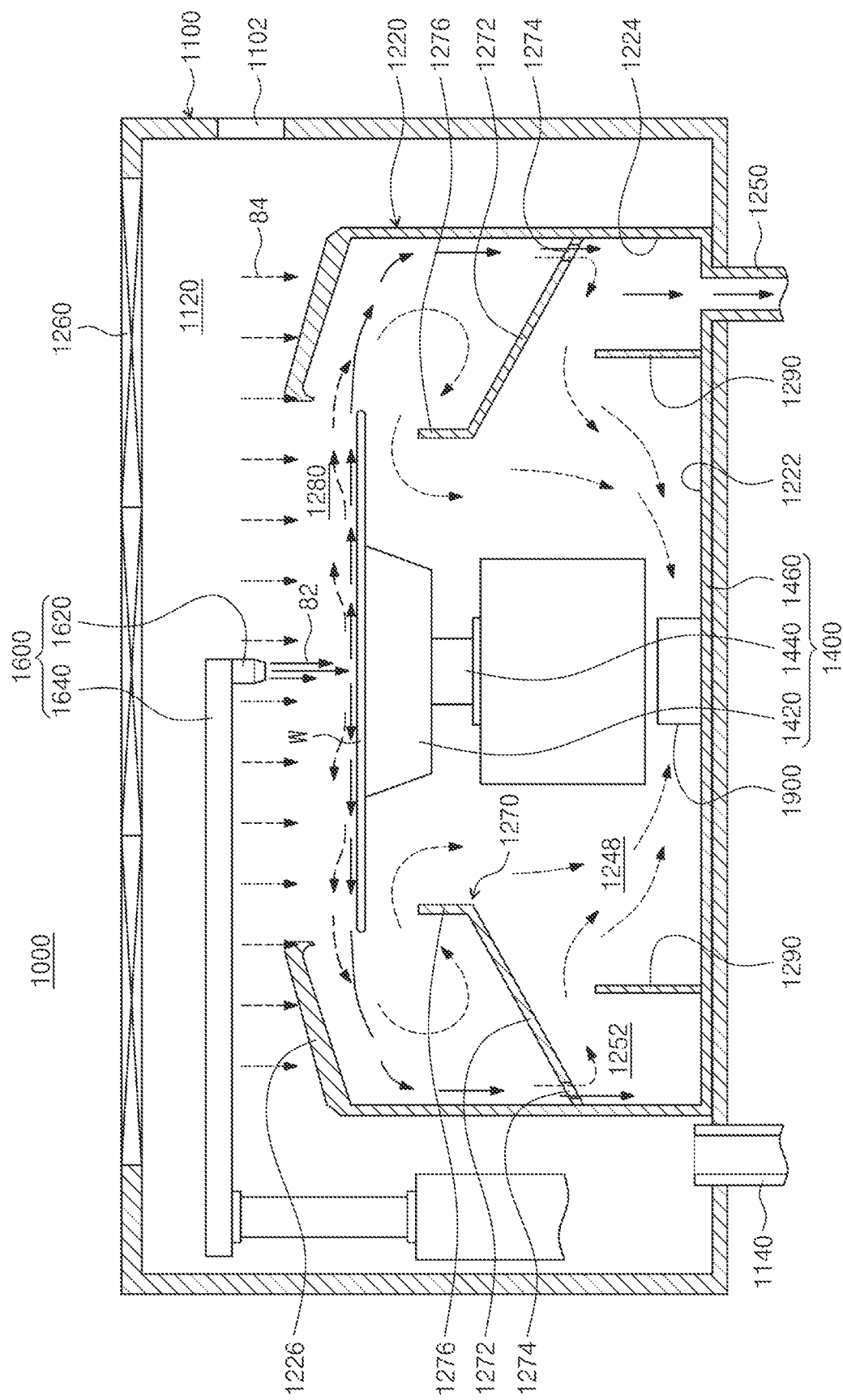
FIG. 12 is a sectional view illustrating flow paths of the air flow and the treating liquid when the substrate is subjected to liquid treatment through the apparatus of FIG. 10.

FIG. 12 illustrates a flow path of the air flow 84 and the treating liquid 82 in the inner space of the processing container when a liquid treatment is conducted on the substrate W when using the apparatus of FIG. 10.

Referring to FIG. 12, during a coating process the substrate W is supported by the support plate 1420 and rotated by the support plate 1420. Outside air is supplied from the fan filter unit 1260 toward the substrate W as a downward airflow 84. In addition, a treating liquid 82 such as a photoresist is supplied from the nozzle 1620 to the substrate W. By the rotation of the substrate W, the airflow 84 flows while bending in the rotation direction of the substrate W in a direction toward the outside of the substrate W in the upper surface of the substrate W and in a region adjacent thereto. When the airflow 84 flows outside the substrate W, the airflow 84 and the treating liquid 82 supplied onto the substrate W are introduced into the top space of the first gas-liquid separation plate 1270. In this case, since the inner cup installed in the conventional substrate treating apparatus is removed, the air flow 84 introduced into the top space of the first gas-liquid separation plate 1270 may be smoothly introduced into the exhaust space 1248 without collision with the internal member or interference by the internal member.

In this case, the treating liquid 82 introduced into the top space of the first gas-liquid separation plate 1270 flows toward the drain hole 1274 formed in the first part 1272 due to the inclination of first part 1272 of the first gas-liquid separation plate 1270, and is then drained to the outside of the processing container 1200 through the drain tube 1250, after falling to the drain space 1252 through the drain hole 1274. The airflow 84 introduced into the space between the second part 1276 of the first gas-liquid separation plate 1270 and the support unit 1400 is introduced into the exhaust space 1248 and then exhausted to the outside of the processing container 1200 through the exhaust pipe 1800.

Hereinafter, a substrate treating apparatus 2000 according to a second embodiment of the inventive concept will be described in more detail with reference to the drawings.

Figure 13:
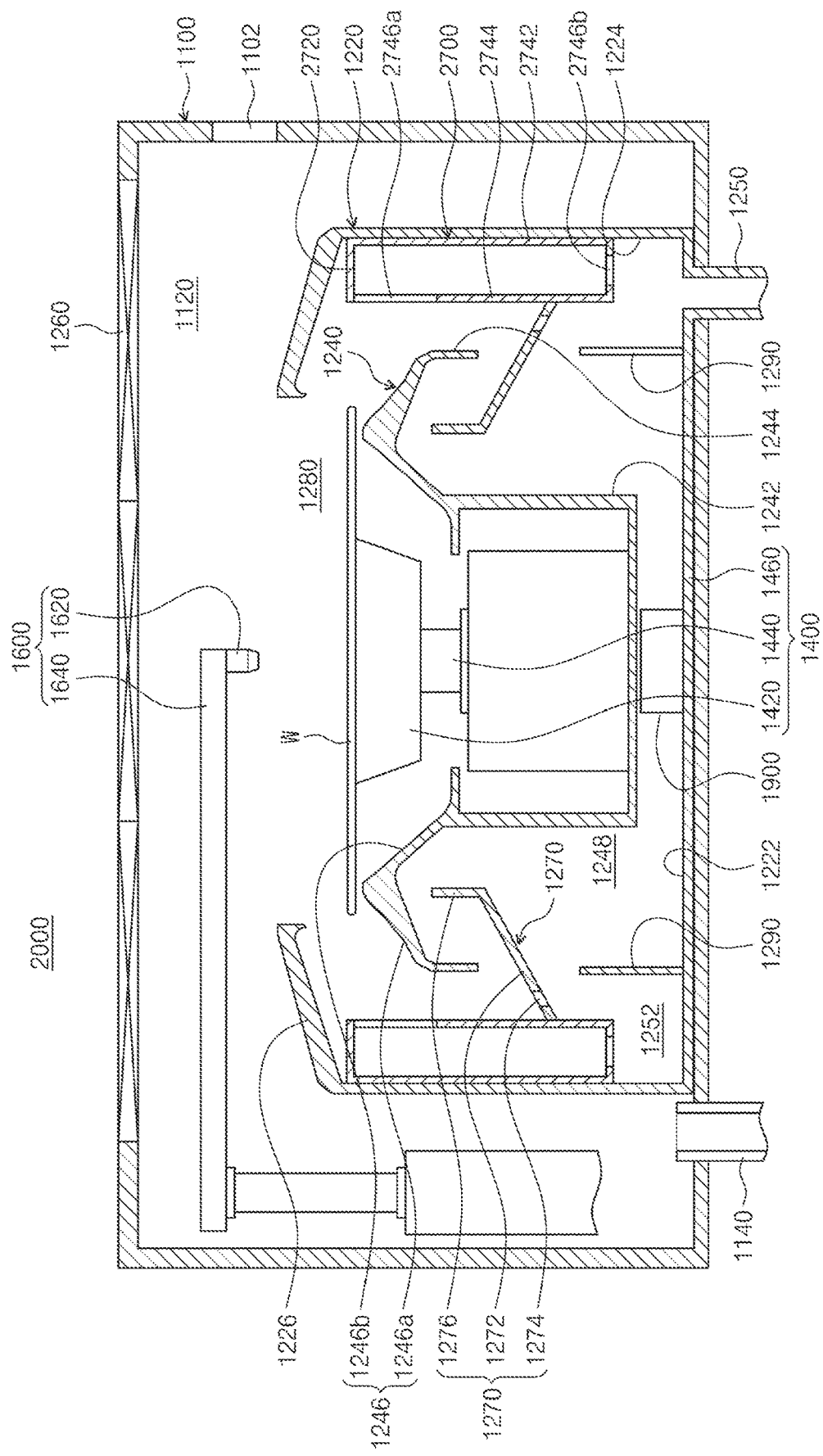
FIG. 13 is a schematic sectional view illustrating a structure of the substrate treating apparatus for treating the substrate by supplying a liquid onto the rotating substrate according to a second embodiment of the inventive concept.
Figure 14:
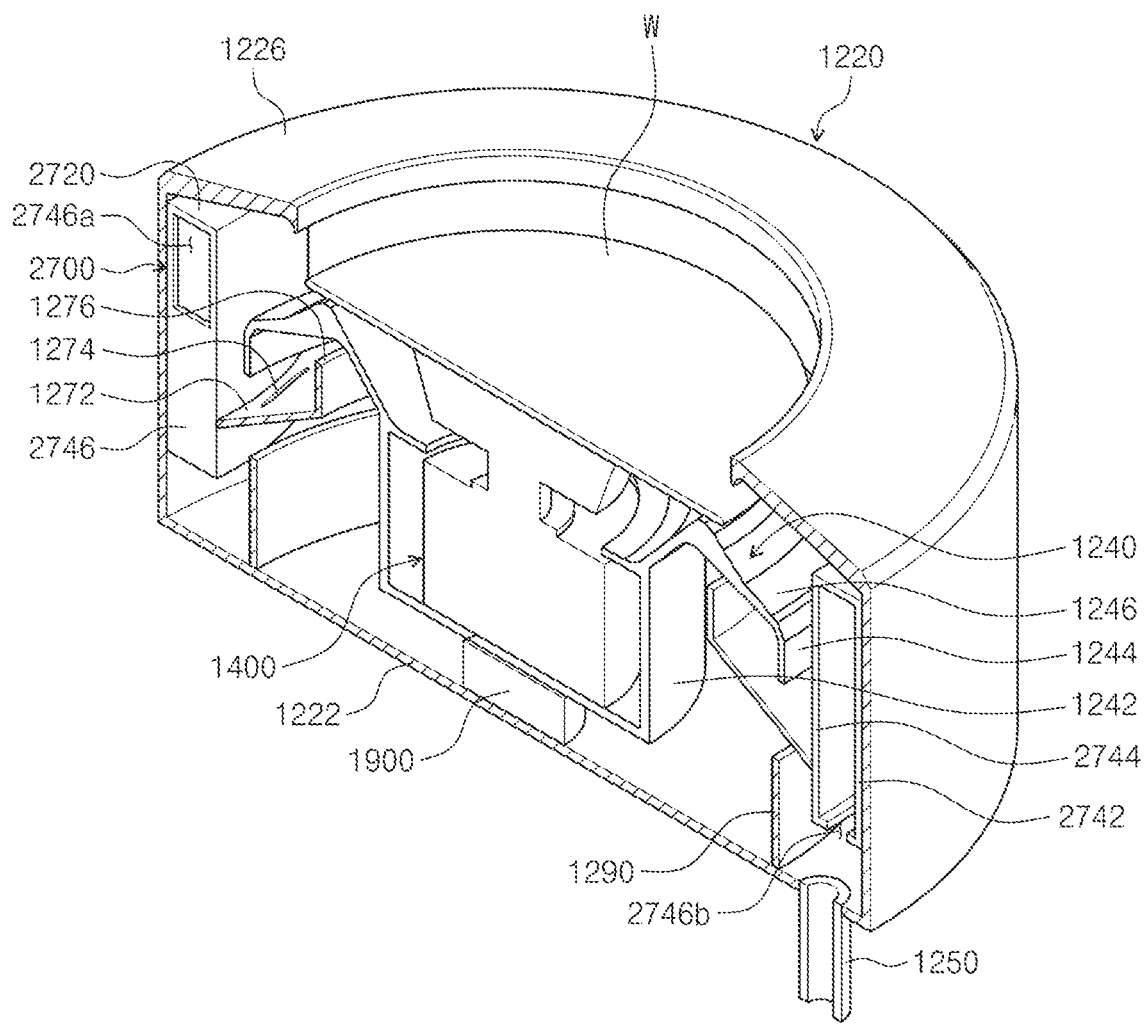
FIG. 14 is a section of a perspective view of the apparatus of FIG. 13.

FIG. 13 illustrates a structure of the substrate treating apparatus for processing the substrate by supplying a liquid to a rotating substrate according to the second embodiment of the inventive concept, and FIG. 14 illustrates a section of the apparatus of FIG. 13.

Referring to FIG. 13 and FIG. 14, the substrate treating apparatus 2000 according to the second embodiment may further include an inner cup 1220 and an air flow guide duct 2700 in addition to the configuration of the substrate treating apparatus 1 according to the first embodiment. Hereinafter, the same reference numerals are assigned to the same components as those of the first embodiment, and a description thereof will be omitted.

The processing container 1200 has an outer cup 1220 and an inner cup 1240.

The inner cup 1240 is located at an inner side of the outer cup 1220. The inner cup 1240 has an inner wall 1242, an outer wall 1244, and a top wall 1246. The inner wall 1242 has a through-hole penetrating in the up/down direction. The inner wall 1242 is disposed to surround the driver 1460. The inner wall 1242 minimizes exposure of the driver 1460 to the air flow 84 in the processing space. The driver 1460 or/and the rotary shaft 1440 of the support unit 1400 extends in the up/down direction through the through-hole. A lower end of the inner wall 1242 may be located on the bottom wall 1222 of the outer cup 1220. The outer wall 1244 is disposed to be spaced apart from the inner wall 1242 and to surround the inner wall 1242. The outer wall 1244 is positioned to be spaced apart from the sidewall 1224 of the outer cup 1220. The inner wall 1242 is disposed to be spaced apart upward from the bottom wall 1222 of the outer cup 1220. The top wall 1246 connects the top end of the outer wall 1244 to the top end of the inner wall 1242. The top wall 1246 has a ring shape and is disposed to surround the support plate 1420.

According to an embodiment, the top wall 1246 has an upwardly convex shape. The top wall 1246 has an outer top wall 1246a upwardly inclined from the top end of the outer wall 1244 toward the rotary shaft 1440, and an inner top wall 1246b downwardly inclined to the top end of the inner wall 1242 from the outer top wall 1246a. The support plate 1420 may be located in a space surrounded by the inner top wall 1246b. According to an embodiment, the top point of the top wall 1226 may be positioned outside the support plate 1420 and more inward than the end of the substrate W supported by the support unit 1400.

The second part 1276 of the first gas-liquid separation plate 1270, and an area of the first part 1272 adjacent to the second part 1276 may be disposed in the inner space of the inner cup 1240. The second part 1276 of the first gas-liquid separation plate 1270 may be positioned between the inner wall 1242 of the inner cup 1240 and the outer wall 1244. The second part 1276 of the first gas-liquid separation plate 1270 may overlap the outer wall 1244 in a perpendicular direction to an axial direction of the rotary shaft 1440.

The drain tube 1250 for draining the treating liquid 82 is connected to the bottom wall 1222 of the outer cup 1220. The drain tube 1250 drains the treating liquid 82 introduced between the sidewall 1224 of the outer cup 1220 and the outer wall 1244 of the inner cup 1240, to the outside of the processing container 1200. According to an embodiment, a space between the side wall 1224 of the outer cup 1220 and the second gas-liquid separation plate 1290 is provided as the drain space 1252 for draining the treating liquid 82, and the drain tube 1250 is provided to drain the treating liquid 82 from the drain space 1252. The air flow 84 flowing into the space between the side wall 1224 of the outer cup 1220 and the outer wall 1244 of the inner cup 1240 flows into the space between the second part 1276 of the first gas-liquid separation plate 1270 and the outer wall 1244 of the inner cup 1240, and flows into the exhaust space 1248. In this process, the treating liquid 82 contained in the air flow 84 is drained from the exhaust space 1252 to the outside of the processing container 1200 through the drain tube 1250, and the air flow is introduced into the exhaust space 1248 of the processing container 1200.

The gas-liquid separation plate may include the second gas-liquid separation plate 1290 provided to the bottom wall 1222 of the outer cup 1220. The second gas-liquid separation plate 1290 may be provided to upwardly extend from the bottom wall 1222 of the outer cup 1220. The second gas-liquid separation plate 1290 may be provided in a ring shape. The second gas-liquid separation plate 1290 may be positioned between the sidewall 1224 of the outer cup 1220 and the outer wall 1244 of the inner cup 1240. Selectively, the gas-liquid separation plate 1230 may be positioned to overlap with the outer wall 1244 of the inner cup 1240 when viewed from above, or may be positioned inside the outer wall 1244 of the inner cup 1240. According to an embodiment, the top end of the gas-liquid separation plate 1230 may be positioned lower than the lower end of the outer wall 1244 of the inner cup 1240.

The exhaust unit 2900 exhausts the air flow 84 in the processing space. The exhaust unit 2900 has an air flow guide duct 2700.

The air flow guide duct 2700 guides the air flow 84 at a height equal to the height of a top surface of the substrate W or at a height adjacent to the top surface of the substrate W. When the substrate W rotates, a downward air flow 84 supplied to a top region of the substrate W flows from a central region of the substrate W toward an edge region of the substrate W by the centrifugal force. Furthermore, on the surface of the substrate W and in a region adjacent thereto, the air flow 84 flows toward the outside of the substrate W while curving in the same direction as the rotating direction of the substrate W. When the air flow 84 deviates from the top surface of the substrate W, the direction of the air flow 84 is tangential to the rotating direction of the substrate W. The air flow guide duct 2700 is provided such that the air flow 84 deviating from the top surface of the substrate W is introduced into the air flow guide duct 2700 in a tangential direction to the rotating direction of the substrate W.

The air flow guide duct 2700 is disposed between the outer cup 1220 and the inner cup 1240. The air flow guide duct 2700 may be provided more adjacent to the outer cup 1220 than the inner cup 1240. In an embodiment, the air flow guide duct 2700 may be installed at an inner wall 1224 of the outer cup 1220. A path of an air flow 84 is provided between the air flow guide duct 2700 and the outer wall 1244 of the inner cup 1240, and part of the air flow 84 may flow through the path. The air flow guide duct has an inlet 2746a and an exit 2746b. The inlet 2746a is provided at an equal position or adjacent position to the substrate W supported by the support unit 1400. The exit 2746b may be provided connecting to the integrated exhaust tube to be further described.

According to an embodiment, the air flow guide duct 2700 has a tubular shape. The air flow guide duct 2700 may be provided with its lengthwise direction in a perpendicular direction to the bottom wall 1222 of the outer cup 1220. The air flow guide duct 2700 has a top wall 2720 and a sidewall 2740. The side wall 2740 has a first surface 2742 facing the inner surface of the outer cup 1220, a second surface 2744 facing the substrate W placed on the support unit 1400, and a third surface 2746 facing a tangential direction to the rotation direction of the substrate W. The top wall 2720 of the air flow guide duct 2700 is offered as a blocking face. The first surface 2742 and the second surface 2744 of the sidewall 2740 of the air flow guide duct 2700 are offered as a blocking face. The inlet 2746a of the air flow guide duct 2700 is formed on the third surface 2746, and a part of the third surface 2746 except for the inlet 2746a is offered as a blocking face. The air flow guide duct 2700 may be provided to have the same cross-sectional area perpendicular to the lengthwise direction thereof. Furthermore, the second surface 2744 of the sidewall 2740 of the air flow guide duct 2700 may be provided further away from the rotary shaft 1440 of the support unit 1400 as the distance from the inlet 2746a increases. Accordingly, the air flow guide duct 2700 may be provided to have a narrower area as it moves away from the inlet 2746a when viewed from the top. The inlet 2746a may be provided in a top region of the first surface 2742. The inlet 2746a may be provided in a rectangular shape.

One or a plurality of air flow guide ducts 2700 can be provided. According to an embodiment, four air flow guide ducts 2700 can be provided and they may be provided at regular intervals based on the center of the rotation of the substrate W.

The exhaust unit 2900 exhausts the air flow 84 within the inner space of the processing container. The exhaust unit 2900 may further include more air flow guide ducts 2700.

Figure 15:
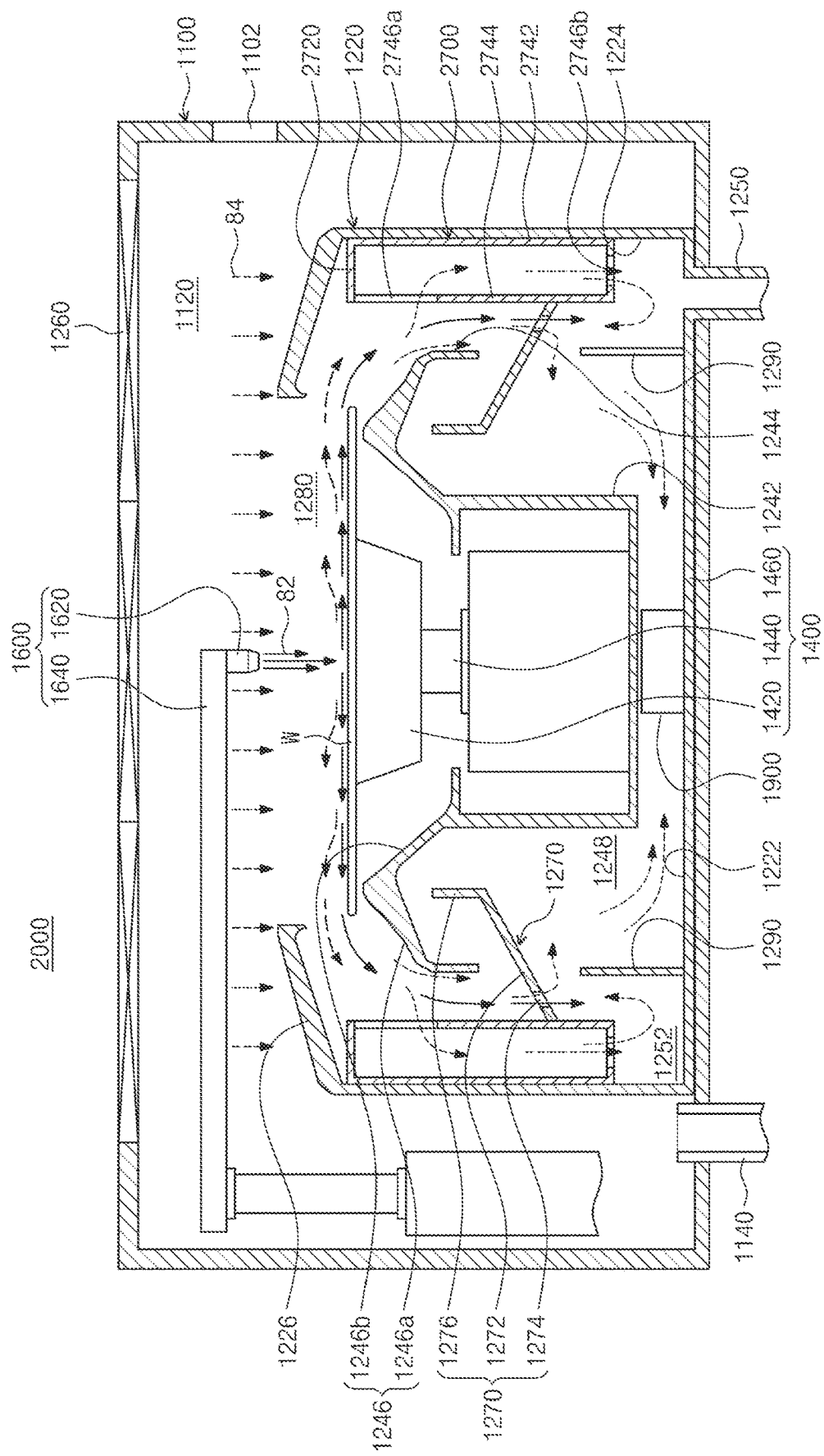
FIG. 15 is a sectional view illustrating flow paths of the air flow and the treating liquid when the substrate is subjected to liquid treatment through the apparatus of FIG. 13.

FIG. 15 illustrate flow paths of the air flow and the treating liquid when the substrate W is subjected to liquid treatment through the apparatus of FIG. 13.

Referring to FIG. 15, in a coating process, the substrate W is supported on the support plate 1420 and is rotated by the support plate 1420. At this time, the support unit 1400 rotates the substrate W such that the air flow 84 generated by the rotation of the substrate W flows toward the inlet 3722 of the air flow guide duct 3700. Outside air is supplied as the downward air flow 84 from the fan filter unit 1260 toward the substrate W. Furthermore, the treating liquid 82 is supplied onto the substrate W from the nozzle 1620. Due to the rotation of the substrate W, the air flow 84 on the top surface of the substrate W flows toward the outside of the substrate W while curving in the rotating direction of the substrate W. When the air flow 84 flows toward the outside of the substrate W, part of the air flow 84 is introduced into the air flow guide duct 3700 and thereafter exhausted outside the processing container 1200. Furthermore, the rest of the air flow 84 flows downward through the gap between the inner cup 1240 and the outer cup 1220. Thereafter, the rest of the air flow 84 is introduced into the exhaust space 1248 in the processing container 1200 and exhausted outside the processing container 1200 through a separate exhaust tube 3820. In addition, the treating liquid 82 used to treat the substrate W is introduced into the drain space 1252 through the space between the inner cup 1240 and the outer cup 1220 and thereafter drained outside the processing container 1200 through the drain tube 1250.

The air flow 84 exhausted from the air flow guide duct 3700 and the separate exhaust tube 3820 is introduced into the air flow introduction part 3842 of an integrated exhaust tube 3840. Thereafter, the treating liquid 82 is separated by the gas-liquid separator 3846, and the air flow 84 is exhausted to the outside through the air flow exhaust part 3844.

According to the embodiment of FIG. 19, part of the air flow 84 is introduced into the air flow guide duct 3700. At this time, the air flow 84 flowing toward the outside of the substrate W by the centrifugal force may be smoothly introduced into the air flow guide duct 3700 without collision or interference with the inner wall 1224 of the processing container 1200 or another external member within the processing container 1200 because the air flow guide duct 3700 is provided such that the air flow 84 is introduced into the air flow guide duct 3700 in the tangential direction with respect to the rotating direction of the substrate W.

Furthermore, part of the air flow 84 is introduced into the exhaust space 1248 in the processing container 1200. However, the amount of air flow 84 introduced into the exhaust space 1248 is very small, as compared with when the air flow guide duct 3700 is not provided. Thus, the air flow 84 may be smoothly exhausted through the exhaust space 1248 without a vortex or a big collision.

Figure 16:
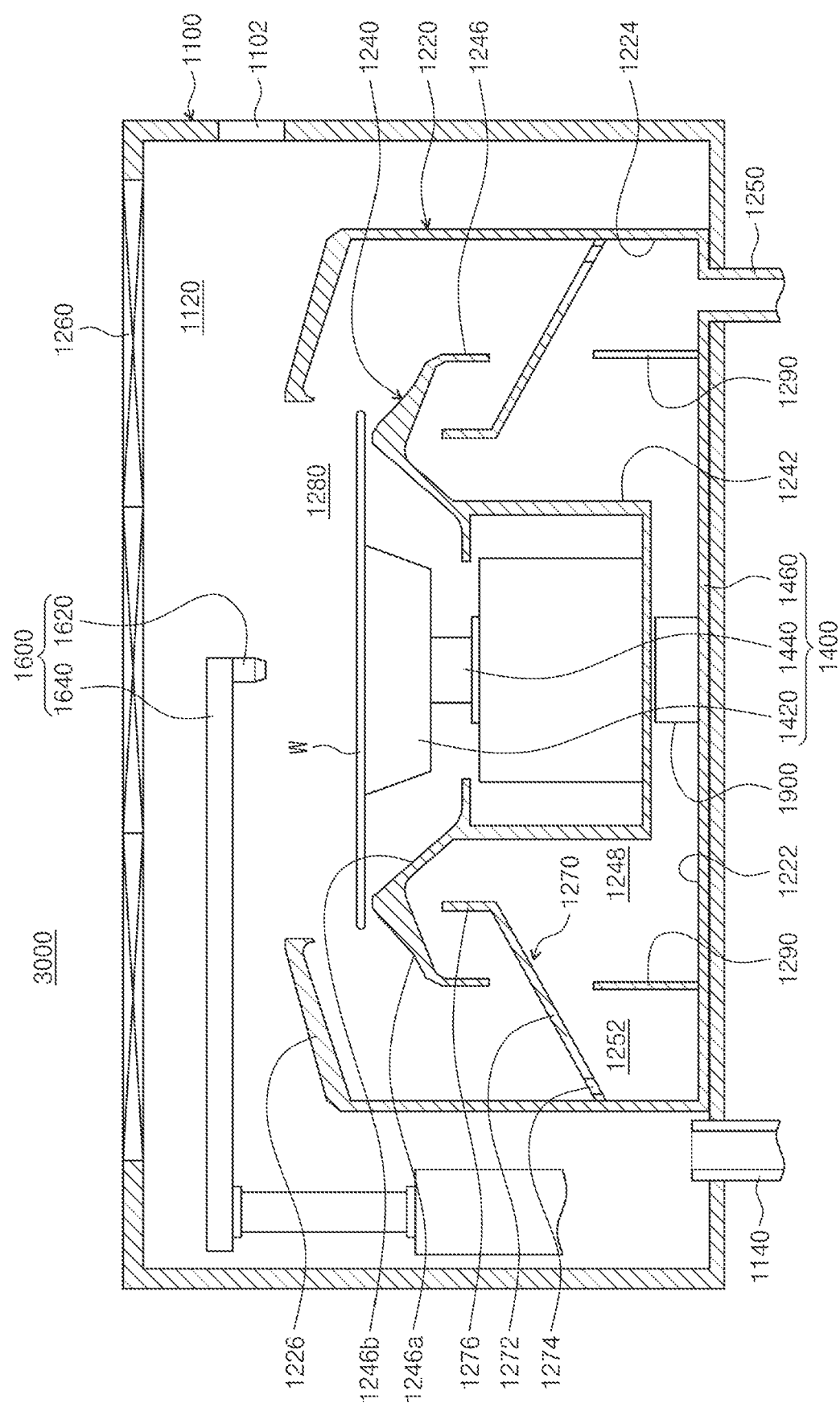
FIG. 16 is a sectional view illustrating a structure of the substrate treating apparatus for treating the substrate by supplying a liquid onto the rotating substrate according to a third embodiment of the inventive concept.

FIG. 16 illustrates flow paths of the air flow and the treating liquid when the substrate W is subjected to liquid treatment through the apparatus of FIG. 13.

Figure 17:
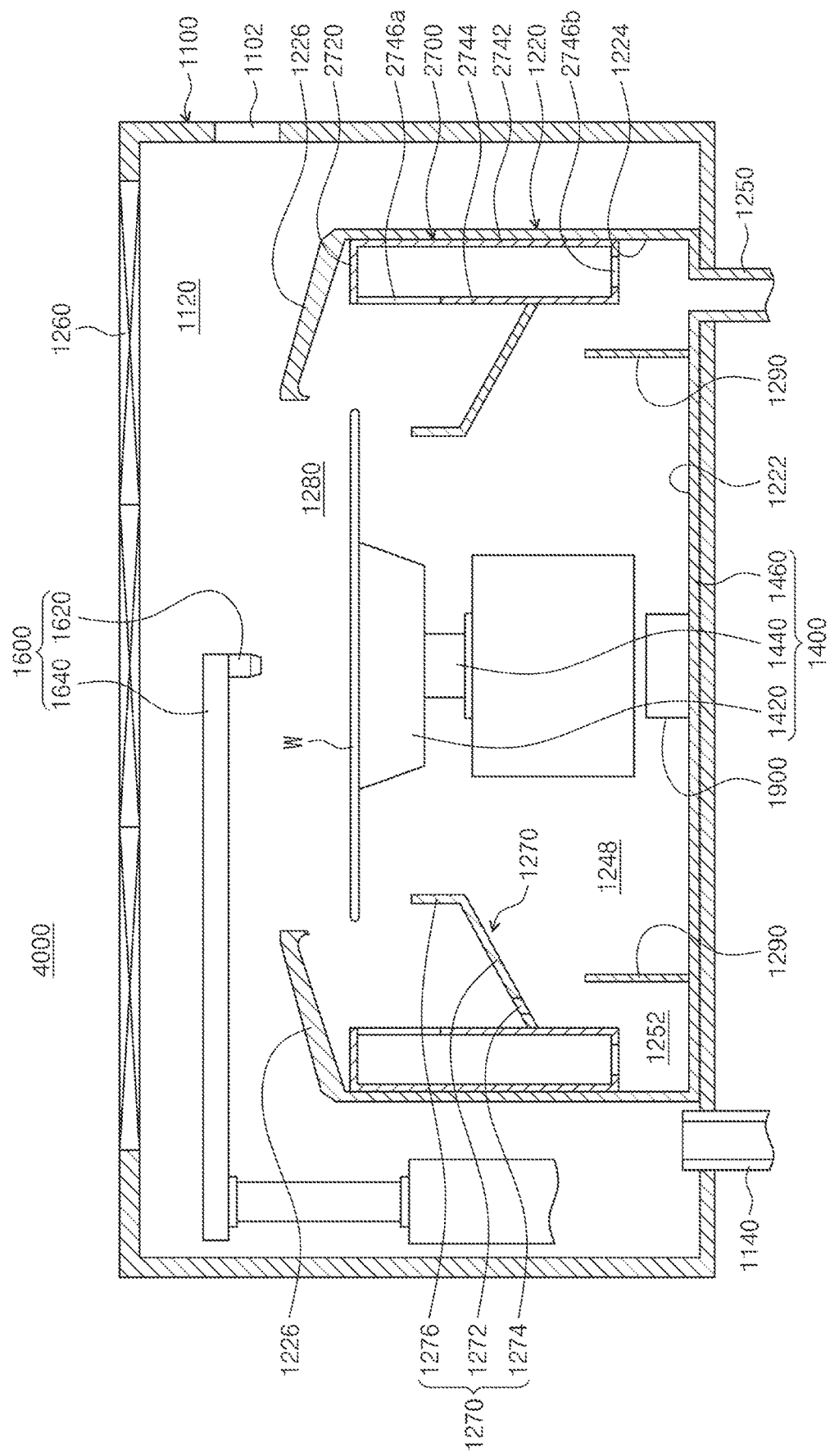
FIG. 17 is a sectional view illustrating a structure of the substrate treating apparatus for treating the substrate by supplying a liquid onto the rotating substrate according to a fourth embodiment of the inventive concept.

Referring to FIG. 16 and FIG. 17, in a coating process, the substrate W is supported on the support plate 1420 and is rotated by the support plate 1420. At this time, the support unit 1400 rotates the substrate W such that the air flow 84 generated by the rotation of the substrate W flows toward the inlet 2746a of the air flow guide duct 2700. Outside air is supplied as the downward air flow 84 from the fan filter unit 1260 toward the substrate W. Furthermore, the treating liquid 82 is supplied onto the substrate W from the nozzle 1620. Due to the rotation of the substrate W, the air flow 84 on the top surface of the substrate W flows toward the outside of the substrate W while turning in the rotating direction of the substrate W. When the air flow 84 flows toward the outside of the substrate W, part of the air flow 84 is introduced into the air flow guide duct 2700 and thereafter exhausted outside the processing container 1200. In addition, a remaining airflow 84 of the air flow 84 flows through a gap between the inner cup 1240 and the outer cup 1220, and then flows into the exhaust space 1248 in the processing container 1200 through the second part 1276 of the first gas-liquid separator 1270 and the outer wall 1244 of the inner cup 1240, and then exhausts to the outside of the processing container 1200 through a separate exhaust unit. Also, the treating liquid 82 having processed the substrate W is introduced into a drain space 1252 through the drain hole 1274 of the first gas-liquid separator 1270, and is drained to the outside of the treating container 1200 through the drain tube 1250.

According to an embodiment of FIG. 13, a part of the air flow 84 is introduced to the air flow guide duct 2700. In this case, since the airflow guide duct 2700 is provided to introduce the airflow 84 in a tangential direction to the rotation direction of the substrate W, the airflow 84 flowing to the outside of the substrate W by a centrifugal force may be smoothly introduced into the airflow guide duct 2700 without collision or interference with the processing container 1200 or a member provided therein.

In addition, some of the airflow 84 is introduced into a top space of the first gas-liquid separation plate 1270, and is exhausted. In this case, since the amount of airflow 84 introduced into the top space of the first gas-liquid separation plate 1270 is very small compared to when the airflow guide duct 2700 is not provided, the airflow may be smoothly exhausted through the exhaust space 1248 without a vortex or a large collision. In addition, when the separation space between the first gas-liquid separation plate 1276 and the inner wall 1242 of the inner cup 1240 is narrowed, an exhaust force is reduced, and the exhaust force may be supplemented through the airflow guide duct 2700.

In the above-described example, the airflow 84 supplied to the substrate W flows into a first path flowing into the exhaust space 1248 located below the support plate 1420 in the processing space, and a second path flowing into the air flow guide duct 2700. However, selectively, the substrate treating apparatus 2000 may be provided such that all of the airflow 84 supplied to the substrate W flows only through the second path.

Hereinafter, the substrate treating apparatuses 3000 and 4000 according to the third and fourth embodiments of the inventive concept will be described with reference to the drawings. The same reference numerals are assigned to the same components as those of the first and second embodiments, and descriptions thereof will be omitted.

FIG. 16 illustrates a structure of a substrate treating apparatus for processing a substrate by supplying liquid to a rotating substrate according to a third embodiment of the inventive concept, and FIG. 17 illustrates a structure of a substrate treating apparatus for processing a substrate according to a fourth embodiment of the inventive concept.

The substrate treating apparatus 3000 according to the third embodiment further includes the inner cup 1240 in the substrate treating apparatus 1000 according to the first embodiment, and the substrate treating apparatus 4000 according to the fourth embodiment further includes the airflow guide duct 2700.

In the above-described example, the air flow guide duct introduces an air flow in a tangential direction to the rotation direction of the substrate W. However, unlike this, the air flow guide duct may be provided to introduce air flow in a direction other than a tangential direction to the rotational direction of the substrate W. For example, the air flow guide duct may be provided such that the inlet thereof is disposed at the same or adjacent height as the substrate and sucks the air flow in the radial direction of the substrate W.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

What is claimed is:

1. An apparatus for treating a substrate, the apparatus comprising:
    a processing container disposed in an inner space, the processing container including:
        a bottom wall,
        a side wall extending from an outside end of the bottom wall,
        a first gas-liquid separation plate extending from the side wall and upwardly inclining toward a support unit, the support unit having a support plate configured to support and rotate the substrate in the inner space, and
        a second gas-liquid separation plate provided at the bottom wall and spaced apart from the first gas-liquid separation plate;
    a liquid supply unit supplying treating liquid to the substrate supported by the support unit; and
    an exhaust unit exhausting an air flow in the inner space.

2. The apparatus of claim 1, wherein the first gas-liquid separation plate includes a first part extending from the sidewall and upwardly inclining toward a rotary shaft of the support unit, and a second part upwardly extending from a top end of the first part.

3. The apparatus of claim 2, wherein the first gas-liquid separation plate includes a drain hole formed in the first part, and the drain hole is provided closer to the side wall of the processing container than to the second part.

4. The apparatus of claim 2, wherein the support unit includes a rotatable support plate on which the substrate is placed, and the second part of the first gas-liquid separation plate is placed at a position lower than the support plate.

5. The apparatus of claim 1, further comprising an air flow guide duct provided to introduce an air flow in a tangential direction to a rotation of the substrate supported by the support unit.

6. The apparatus of claim 5, wherein the air flow guide part is located inside the inner space of the processing container.

7. The apparatus of claim 1, further comprising:
    a fan unit supplying a downward air flow to the inner space; and
    a treating liquid nozzle supplying a treating liquid to the substrate supported by the support unit.

8. The apparatus of claim 1, wherein the second gas-liquid separation plate is placed under and spaced apart from the first part of the first gas-liquid separation plate.

9. The apparatus of claim 8, wherein the inner space includes a discharge space formed between the first gas-liquid separation plate and an outside region of the second gas-liquid separation plate, and an exhaust space formed between the first gas-liquid separation plate and an inner region space of the second gas-liquid separation plate, and wherein the exhaust unit exhausts an air flow introduced into the exhaust space to the outside of the inner space.

10. The apparatus of claim 9, wherein the air flow introduced into the discharge space is introduced into the exhaust space through the second gas-liquid separation plate.

11. The apparatus of claim 10, wherein the air flow guide duct is provided between the second gas-liquid separation plate and an inner wall of the processing container.

12. The apparatus of claim 11, wherein the air flow guide duct is provided with its lengthwise direction in an up/down direction, the air flow guide duct includes a top wall and a side wall, the top wall serving as a blocking face, an inlet formed at the side wall facing a direction parallel to a tangential line of the substrate supported by the support unit, the rest of the wall serving as a blocking face.

13. The apparatus of claim 12, wherein a plurality of air flow guide ducts are placed apart in a circumferential direction of the substrate.

14. An apparatus for treating a substrate, the apparatus comprising:
a processing container disposed in an inner space, the processing container including
an outer cup providing the inner space;
an inner cup placed apart from the outer cup and placed in the inner space;
a first gas-liquid separation plate provided at a side wall of the outer cup and upwardly inclining toward a support unit; and
a second gas-liquid separation plate provided at the bottom wall of the outer cup and spaced apart from the first gas-liquid separation plate;
a support unit having a support plate configured to support and rotate the substrate in the inner space;
a liquid supply unit supplying treating liquid to the substrate supported by the support unit; and
an exhaust unit exhausting an air flow in the inner space.

15. The apparatus of claim 14, wherein the first gas-liquid separation plate includes:
a first part upwardly inclining and extending from the sidewall of the outer cup in a direction of the rotary shaft of the support unit; and
a second part upwardly extending from the top end of the first part.

16. The apparatus of claim 15, wherein the inner cup comprises:
an inner wall provided to surround the support unit;
an outer wall provided to surround the inner wall; and
a top wall connecting the top end of the inner wall and the top end of the outer wall,
wherein the outer wall of the inner cup is placed apart from the second part of the first gas-liquid separation plate.

17. The apparatus of claim 14, wherein the exhaust unit further includes an air flow guide duct placed between the inner cup and the outer cup and provided to introduce an air flow in a tangential direction to the rotation direction of the substrate supported by the support unit.

18. The apparatus of claim 17, wherein the second gas-liquid separation plate is provided under the first part of the first gas-liquid separation plate, and placed apart from the first part, the inner space includes an exhaust space formed between the first gas-liquid separation plate and an outside region of second gas-liquid separation plate, and an exhaust space formed between the first gas-liquid separation plate and an inner region of the second gas-liquid separation plate,
the exhaust unit exhausting an air flow introduced into the exhaust region to the outside of the inner space.

19. An apparatus for treating a substrate, the apparatus comprising:
a processing container having an inner space;
a support unit having a support plate configured to support and rotate the substrate in the inner space;
a liquid supply unit supplying a treating liquid to the substrate supported by the support unit; and
an exhaust unit exhausting an air flow in the inner space,
wherein the processing container includes:
an outer cup providing the inner space;
an inner cup placed apart from the outer cup and placed in the inner space,
the processing container including:
a first gas-liquid separator provided at a side wall of the outer cup; and
a second gas-liquid separator provided at a bottom wall of the outer cup,
the exhaust unit including an air guide duct placed between the inner cup and the outer cup,
the air flow guide duct introducing an air flow in a tangential direction to a rotation direction of the substrate supported by the support unit.

* * * * *